US012588370B2

(12) United States Patent
Jung et al.

(10) Patent No.: US 12,588,370 B2
(45) Date of Patent: Mar. 24, 2026

(54) DISPLAY APPARATUS

(71) Applicant: Samsung Display Co., Ltd., Yongin-Si (KR)

(72) Inventors: Eunae Jung, Yongin-si (KR); Eunhye Kim, Yongin-si (KR); Kiho Bang, Yongin-si (KR); Inhyuck Yeo, Yongin-si (KR); Seunghwan Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 395 days.

(21) Appl. No.: 18/129,781

(22) Filed: Mar. 31, 2023

(65) Prior Publication Data

US 2024/0008321 A1     Jan. 4, 2024

(30) Foreign Application Priority Data

Jun. 30, 2022     (KR) ........................ 10-2022-0080712

(51) Int. Cl.
*H10K 59/124*          (2023.01)
*H10K 59/126*          (2023.01)

(52) U.S. Cl.
CPC ......... *H10K 59/124* (2023.02); *H10K 59/126* (2023.02)

(58) Field of Classification Search
CPC ...... G06F 3/041–047; G06F 2203/041–04114; G06F 3/0412; G06F 3/04164; H10K 59/00–95; G09G 2330/06; G09G 3/32; G09G 2320/0214; G09G 3/3208; G09G 2330/04; G09G 2320/0209
See application file for complete search history.

(56) References Cited

U.S. PATENT DOCUMENTS

| | | | |
|---|---|---|---|
| 10,170,534 | B1 | 1/2019 | Kim et al. |
| 11,574,972 | B2 | 2/2023 | Kang et al. |
| 2006/0022587 | A1 | 2/2006 | Jeong et al. |
| 2020/0091252 | A1 | 3/2020 | Bang et al. |

(Continued)

FOREIGN PATENT DOCUMENTS

| | | |
|---|---|---|
| KR | 2005-0115705 A | 12/2005 |
| KR | 10-2019-0031397 A | 3/2019 |

(Continued)

*Primary Examiner* — Sanjiv D. Patel
(74) *Attorney, Agent, or Firm* — Innovation Counsel LLP

(57) ABSTRACT

Provided is a display apparatus including: a substrate having a display area, a first corner area, and a second corner area disposed outside the first corner area; an inorganic insulating layer disposed on the substrate; a first planarization layer and a second planarization layer disposed on the inorganic insulating layer, each of the first planarization layer and the second planarization layer overlapping the first corner area; a third planarization layer disposed on the second planarization layer and overlapping the first corner area and the second corner area; a display element layer disposed on the third planarization layer; a first shielding layer disposed on the third planarization layer and overlapping the first corner area and the second corner area, wherein a plurality of first holes are defined in the first shielding layer; and a second shielding layer disposed on the inorganic insulating layer and overlapping the second corner area.

19 Claims, 21 Drawing Sheets

(56)          References Cited

U.S. PATENT DOCUMENTS

2021/0064172 A1*   3/2021   Lee ....................... G06F 3/0446
2021/0083013 A1     3/2021   Bang et al.
2021/0225834 A1*   7/2021   Kim .................... G09G 3/3266

FOREIGN PATENT DOCUMENTS

KR          2019-0093228  A      8/2019
KR          2020-0032291  A      3/2020
KR      10-2021-0029339  A      3/2021
KR          2021-0032608  A      3/2021

* cited by examiner

DISPLAY APPARATUS

CROSS-REFERENCE TO RELATED APPLICATION

This application is based on and claims priority under 35 U. S. C. § 119 to Korean Patent Application No. 10-2022-0080712, filed on Jun. 30, 2022, in the Korean Intellectual Property Office, the disclosure of which is incorporated by reference herein in its entirety.

BACKGROUND

1. Field

One or more embodiments relate to a display apparatus, and more particularly, to a display apparatus, in which the area of a dead space of the display apparatus is reduced and signal interference between wirings is reduced.

2. Description of the Related Art

In general, thin-film transistors configured to control luminance or the like of light-emitting diodes are arranged in a display area of a display apparatus. The thin-film transistors are configured to control the corresponding light-emitting diodes to emit light having a certain color by using a data signal, a driving voltage, and a common voltage transmitted thereto.

In order to provide the data signal, the driving voltage, and the common voltage, a data driving circuit, a driving voltage supply line, a common voltage supply line, and the like are located in a peripheral area outside the display area. The peripheral area is a dead space where an image is not implemented.

SUMMARY

As the proportion of a display area enabling images to be displayed in a display apparatus increases, a peripheral area as a dead space is reduced. A shielding layer is required to prevent interference between overlapping wirings due to a reduction in the peripheral area. Because the shielding layer prevents the discharge of gas generated from a layer including an organic material, the quality of light emitted from adjacent light-emitting diodes may be deteriorated.

One or more embodiments include a display apparatus which is capable of displaying a high-quality image while the area of a dead space is reduced. However, this is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus includes a substrate including a display area, a first corner area at a corner of the display area, and a second corner area disposed outside the first corner area, an inorganic insulating layer disposed on the substrate, a first planarization layer and a second planarization layer disposed on the inorganic insulating layer, each of the first planarization layer and the second planarization layer overlapping the first corner area, a third planarization layer disposed on the second planarization layer and overlapping the first corner area and the second corner area, a display element layer disposed on the third planarization layer, the display element layer including a pixel electrode, an emission layer, and an opposite electrode, a first shielding layer disposed on the third planarization layer and overlapping the first corner area and the second corner area, wherein a plurality of first holes are defined in the first shielding layer, and a second shielding layer disposed on the inorganic insulating layer and overlapping the second corner area.

In an embodiment, the opposite electrode may extend from the display area to the first corner area, and the first corner area may be covered with the first shielding layer and the opposite electrode in a plan view.

In an embodiment, the second shielding layer may be in direct contact with the inorganic insulating layer in the second corner area.

In an embodiment, the display apparatus may further include a third shielding layer disposed between the second planarization layer and the third planarization layer and overlapping the first corner area, a plurality of second holes may be defined in the third shielding layer, wherein the plurality of first holes may overlap the plurality of second holes.

In an embodiment, an overlapping area of the plurality of first holes and the plurality of second holes may be 13% or more of a total area of the first corner area.

In an embodiment, the second shielding layer and the third shielding layer may be integrally formed as a single body.

In an embodiment, the second corner area may be covered with the first shielding layer and the second shielding layer in a plan view.

According to one or more embodiments, a display apparatus includes a substrate including a display area, a first peripheral area surrounding at least a portion of the display area, and a second peripheral area disposed outside the first peripheral area, an inorganic insulating layer disposed on the substrate, a first planarization layer, a second planarization layer, and a third planarization layer sequentially disposed on the inorganic insulating layer in this stated order, a display element layer disposed on the third planarization layer, the display element layer including a pixel electrode, an emission layer, and an opposite electrode, a first shielding layer disposed on the third planarization layer, wherein a plurality of first holes may be defined in the first shielding layer, a second shielding layer disposed on the second planarization layer and overlapping the first peripheral area, wherein a plurality of second holes may be defined in the second shielding layer, and a third shielding layer disposed between the inorganic insulating layer and the second planarization layer and overlapping the second peripheral area, wherein a plurality of third holes may be defined in the third shielding layer.

In an embodiment, the opposite electrode may extend from the display area to the first peripheral area, and the first peripheral area may be covered with the first shielding layer, the second shielding layer, and the opposite electrode in a plan view.

In an embodiment, the display apparatus may further include a valley portion passing through the first planarization layer, the second planarization layer, and the third planarization layer, wherein the first shielding layer may cover the valley portion.

In an embodiment, the plurality of first holes may be spaced apart from the valley portion.

In an embodiment, the display apparatus may further include a valley portion passing through the first planarization layer, the second planarization layer, and the third planarization layer, wherein the opposite electrode may cover the valley portion.

In an embodiment, the display apparatus may further include a first driving circuit disposed between the substrate and the first planarization layer and overlapping the first peripheral area, and a second driving circuit disposed between the substrate and the first planarization layer and overlapping the second peripheral area.

In an embodiment, an overlapping area of the plurality of first holes and the plurality of second holes in the first peripheral area may be 13% or more of a total area of the first peripheral area.

In an embodiment, the second peripheral area may be covered with the first shielding layer and the third shielding layer in a plan view.

In an embodiment, the display apparatus may further include a fourth shielding layer overlapping the second peripheral area, wherein a plurality of fourth holes may be defined in the fourth shielding layer, wherein the fourth shielding layer may be disposed on a layer that is different from the third shielding layer, and the second peripheral area may be covered with the first shielding layer, the third shielding layer, and the fourth shielding layer in a plan view.

In an embodiment, the display apparatus may further include a fourth shielding layer disposed on the second planarization layer and overlapping the second peripheral area, wherein a plurality of fourth holes may be defined in the fourth shielding layer, and a fifth shielding layer disposed on the inorganic insulating layer and overlapping the second peripheral area, wherein a plurality of fifth holes may be defined in the fifth shielding layer, wherein the second peripheral area may be covered with the first shielding layer, the third shielding layer, the fourth shielding layer, and the fifth shielding layer in a plan view.

According to one or more embodiments, a display apparatus includes a substrate including a display area, a first peripheral area surrounding at least a portion of the display area, and a second peripheral area disposed outside the first peripheral area, an inorganic insulating layer disposed on the substrate, a first planarization layer, a second planarization layer, and a third planarization layer sequentially disposed on the inorganic insulating layer in this stated order, a display element layer disposed on the third planarization layer, the display element layer including a pixel electrode, an emission layer, and an opposite electrode, a first shielding layer disposed on the third planarization layer, wherein a plurality of first holes may be defined in the first shielding layer, a third shielding layer between the inorganic insulating layer and the second planarization layer and overlapping the second peripheral area, wherein a plurality of third holes may be defined in the third shielding layer, and a fourth shielding layer disposed on a layer that is different from the first shielding layer and the third shielding layer and overlapping the second peripheral area, wherein a plurality of fourth holes may be defined in the fourth shielding layer.

In an embodiment, the opposite electrode may extend from the display area to the first peripheral area, and the first peripheral area may be covered with the first shielding layer and the opposite electrode in a plan view.

In an embodiment, the display apparatus may further include a fifth shielding layer overlapping the second peripheral area, wherein a plurality of fifth holes may be defined in the fifth shielding layer, wherein the fifth shielding layer may be covered with the first shielding layer, the third shielding layer, and the fourth shielding layer, and the second peripheral area may be covered with the first shielding layer, the third shielding layer, the fourth shielding layer, and the fifth shielding layer in a plan view.

Other aspects, features, and advantages of the disclosure will become better understood through the accompanying drawings, the claims, and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
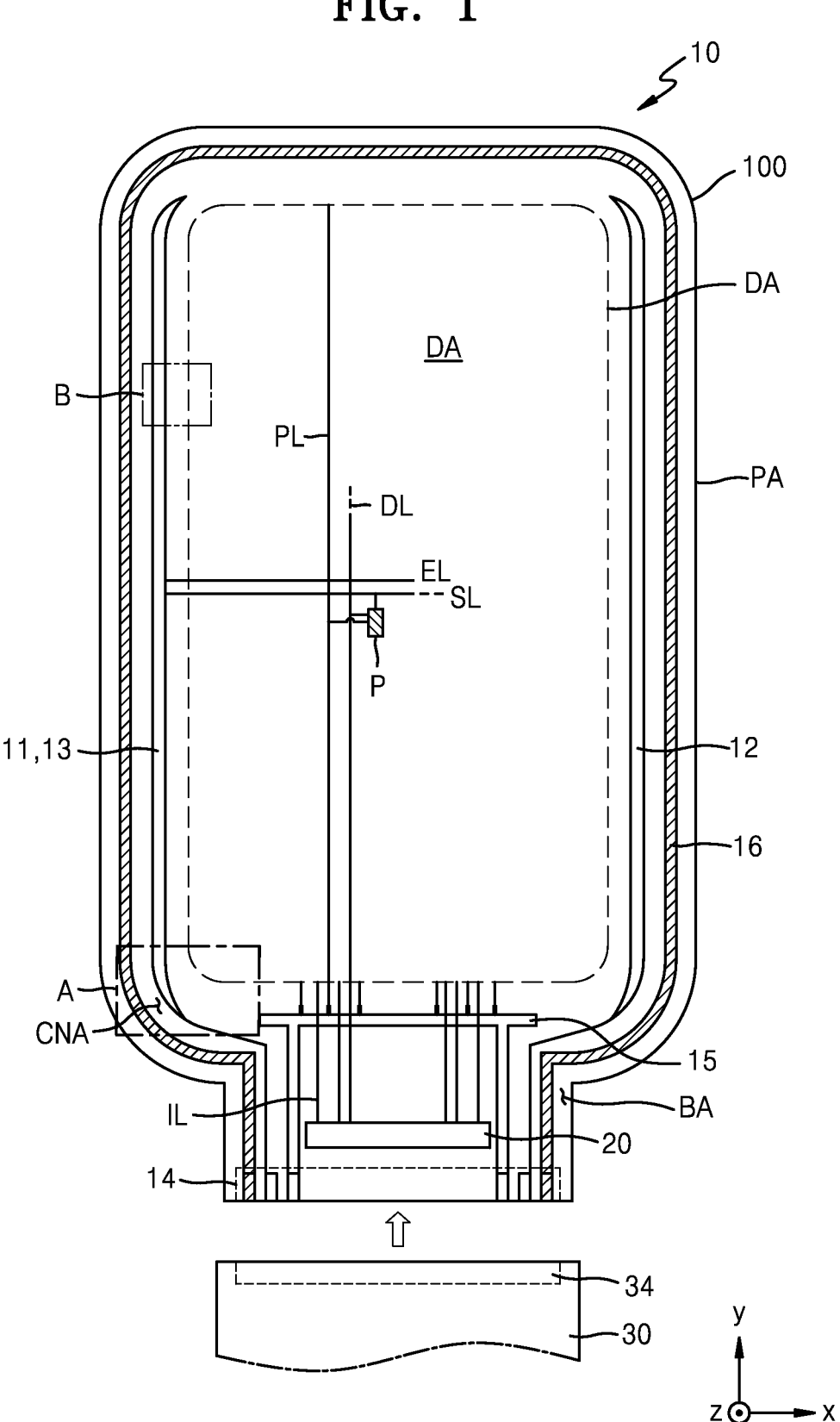
FIG. 1 is a plan view schematically illustrating a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure and methods of achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals.

It will be understood that although the specification, the "first," "second" etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "include" and/or "comprise" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. That is, for example, intervening layers, regions, or elements may be present.

It will be further understood that when layers, regions, or elements are referred to as being connected to each other, they may be directly connected to each other or indirectly connected to each other with intervening layers, regions, or elements therebetween. For example, when layers, regions, or elements are referred to as being electrically connected to each other, they may be directly electrically connected to each other or indirectly electrically connected to each other with intervening layers, regions, or elements therebetween.

In this specification, the expression "A and/or B" indicates only A, only B, or both A and B. In this specification, the expression "at least one of A and B" indicates only A, only B, or both A and B.

In the present specification, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

FIG. 1 is a plan view schematically illustrating a portion of a display apparatus according to an embodiment.

As illustrated in FIG. 1, the display apparatus according to the present embodiment includes a display panel 10. The disclosure may be applied to any types of display apparatus as long as the display apparatus includes the display panel 10. For example, the display apparatus may be a variety of products, such as a smartphone, a tablet, a laptop, a television, or a billboard.

The display panel 10 includes a display area DA and a peripheral area PA outside the display area DA. The display area DA enables an image to be displayed, and a plurality of pixels P may be arranged in the display area DA. When viewed from a direction substantially perpendicular to the display panel 10, the display area DA may have various shapes, such as a circular shape, an elliptical shape, a polygonal shape, or a specific figure shape. FIG. 1 illustrates that the display area DA has an approximately rectangular shape with round corners.

Each of the pixels P refers to a sub-pixel and may include a display element, such as an organic light-emitting diode (OLED). Each of the pixels P may emit, for example, red light, green light, blue light, or white light.

The peripheral area PA may be outside the display area DA. External circuits configured to drive the pixel P may be arranged in the peripheral area PA. A first scan driving circuit 11, a second scan driving circuit 12, an emission control driving circuit 13, a terminal 14, a first power supply line 15, and a second power supply line 16 may be arranged in the peripheral area PA.

The first scan driving circuit 11 may be configured to provide a scan signal to the pixel P through a scan line SL. The second scan driving circuit 12 may be arranged in parallel with the first scan driving circuit 11 with the display area DA therebetween. Some pixels P in the display area DA may be electrically connected to the first scan driving circuit 11, and the other pixels P may be electrically connected to the second scan driving circuit 12. When necessary, the second scan driving circuit 12 may be omitted, and all the pixels P in the display area DA may be electrically connected to the first scan driving circuit 11.

The emission control driving circuit 13 may be arranged closer to the first scan driving circuit 11 and may be configured to provide an emission control signal to the pixel P through an emission control line EL. Although FIG. 1 illustrates that the emission control driving circuit 13 is arranged only on one side of the display area DA, the emission control driving circuit 13 may be arranged on both sides of the display area DA, as in the first scan driving circuit 11 and the second scan driving circuit 12.

The peripheral area PA may include a bending area BA extending to the −y-direction of the display area DA. The bending area BA is bent toward the rear surface of the display area DA, and thus, the area of the non-display area visible when viewed from the front of the display apparatus may be reduced.

A driving chip 20 may be arranged in the bending area BA. The driving chip 20 may include an integrated circuit configured to drive the display panel 10. The integrated circuit may be a data driving integrated circuit configured to generate a data signal, but the disclosure is not limited thereto. Although the driving chip 20 is mounted on the same surface as the display surface of the display area DA, the driving chip 20 may be located on the rear surface of the display area DA as the display panel 10 is bent as described above.

The terminal 14 may be arranged in the bending area BA. The terminal 14 may be exposed without being covered with an insulating layer, so as to be electrically connected to a printed circuit board 30. A terminal 34 of the printed circuit board 30 may be electrically connected to the terminal 14 of the display panel 10.

The printed circuit board 30 is configured to transmit a signal or power from a controller (not illustrated) to the display panel 10. A control signal, which is generated by the controller, may be transmitted to the first scan driving circuit 11, the second scan driving circuit 12, and the emission control driving circuit 13 through the printed circuit board 30. Also, the controller may be configured to transmit a first power supply voltage (ELVDD or a driving voltage) to the first power supply line 15 and provide a second power supply voltage (ELVSS or a common voltage) to the second power supply line 16. The first power supply voltage (ELVDD) may be transmitted to each of the pixels P through a driving voltage line PL connected to the first power supply line 15, and the second power supply voltage may be transmitted to an opposite electrode of the pixel P connected to the second power supply line 16. The first power supply line 15 may have a shape extending from the lower side of the display area DA in one direction (e.g., the x direction). The second power supply line 16 may have a loop shape with one side open, and may have a shape that partially surrounds the display area DA.

On the other hand, the controller may be configured to generate a data signal, and the generated data signal may be transmitted to an input line IL through the driving chip 20 and transmitted to the pixel P through a data line DL connected to the input line IL. For reference, the term "line" may refer to a "wiring." This is equally applied to embodiments and modifications to be described below.

The peripheral area PA may include a corner area CNA that at least partially surrounds a corner portion of the display area DA adjacent to the bending area BA. The corner area CNA may be an area where the peripheral area PA extending y-direction is connected to the peripheral area PA extending in the x-direction.

Hereinafter, an organic light-emitting display apparatus will be described as an example of the display apparatus according to the embodiment, but the display apparatus according to the disclosure is not limited thereto. In another embodiment, examples of the display apparatus according to the disclosure may include an inorganic light-emitting display (or an inorganic electroluminescence (EL) display), a quantum dot light-emitting display, and the like. For example, an emission layer of a display element included in the display apparatus may include an organic material or an inorganic material. Also, the display apparatus may include an emission layer and quantum dots located on a path of light emitted from the emission layer.

Figure 2:
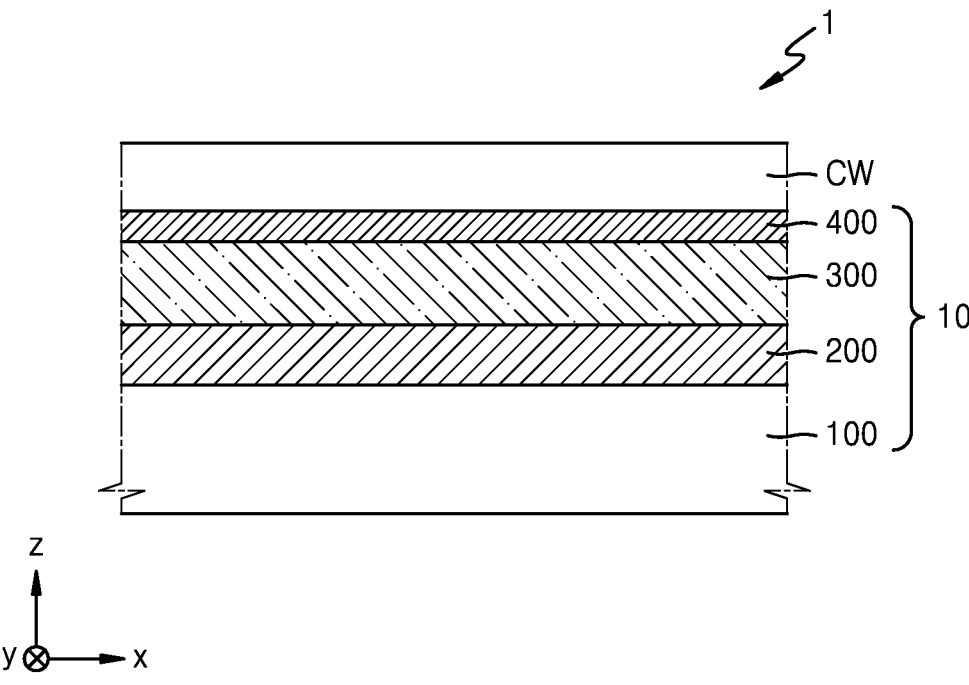
FIG. 2 is a cross-sectional view schematically illustrating a portion of a display apparatus according to an embodiment.

FIG. 2 is a cross-sectional view schematically illustrating a portion of a display apparatus 1 according to an embodiment.

Referring to FIG. 2, the display apparatus 1 may include a display panel 10 and a cover window CW.

The display panel 10 may include a substrate 100, a display layer 200, an encapsulation layer 300, and an input sensing layer 400. The substrate 100 may include an insulating material, such as glass, quartz, or polymer resin. The substrate 100 may be a rigid substrate or a bendable, foldable, rollable, flexible substrate. For example, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multilayer structure including an inorganic layer (not illustrated) and a layer including the polymer resin described above. For example, the substrate 100 may include two layers having the polymer resin described above and an inorganic barrier layer between the two layers.

The display layer 200 may be disposed on the substrate 100. The display layer 200 may include pixels and may be configured to display an image. The display layer 200 may include display elements and pixel circuits electrically connected to the display elements. Also, the display layer 200 may include scan lines, data lines, driving voltage lines, and driving circuits, which are connected to the pixel circuits, and fan-out lines connecting the data lines to the driving circuit.

The encapsulation layer 300 may be disposed on the display layer 200 so as to encapsulate the display element. The encapsulation layer 300 may include at least one organic encapsulation layer and provide a more planarized base surface. Therefore, even when the input sensing layer 400 to be described below is formed by a continuous process, a defect rate may be reduced.

The input sensing layer 400 may be disposed directly on the encapsulation layer 300. The input sensing layer 400 may include touch electrodes and an input sensing line connected to the touch electrodes, and may be configured to sense a user touch. In the disclosure, a method of operating the input sensing layer 400 is not particularly limited, and the input sensing layer 400 may be configured to sense an external input by using a capacitance method, an electromagnetic induction method, or a pressure sensing method.

The "layers" constituting the display panel 10 may be formed through a continuous process with other components. For example, the substrate 100 of the display panel 10 may function as a base layer providing a base surface. The display layer 200, the encapsulation layer 300, and the input sensing layer 400 may be disposed on a base surface provided by other components.

The cover window CW may be disposed on the display panel 10. The cover window CW may protect the upper surface of the display panel 10. The cover window CW may be bonded to the display panel 10 by using an optically clear adhesive (OCA) or an optically clear resin (OCR).

Although not illustrated in FIG. 2, a functional module may be optionally between the cover window CW and the display panel 10. The functional module may include at least one functional layer. The functional layer may be configured to perform color filtering, color conversion, polarization, and the like. The functional layer may be a sheet layer including a sheet, a film layer including a film, a thin-film layer, a coating layer, a panel, a plate, or the like. One functional layer may include a single layer, or may include a plurality of laminated thin-films or coating layers. For example, the functional layer may be a color filter, an optical film, or the like.

Figure 3:
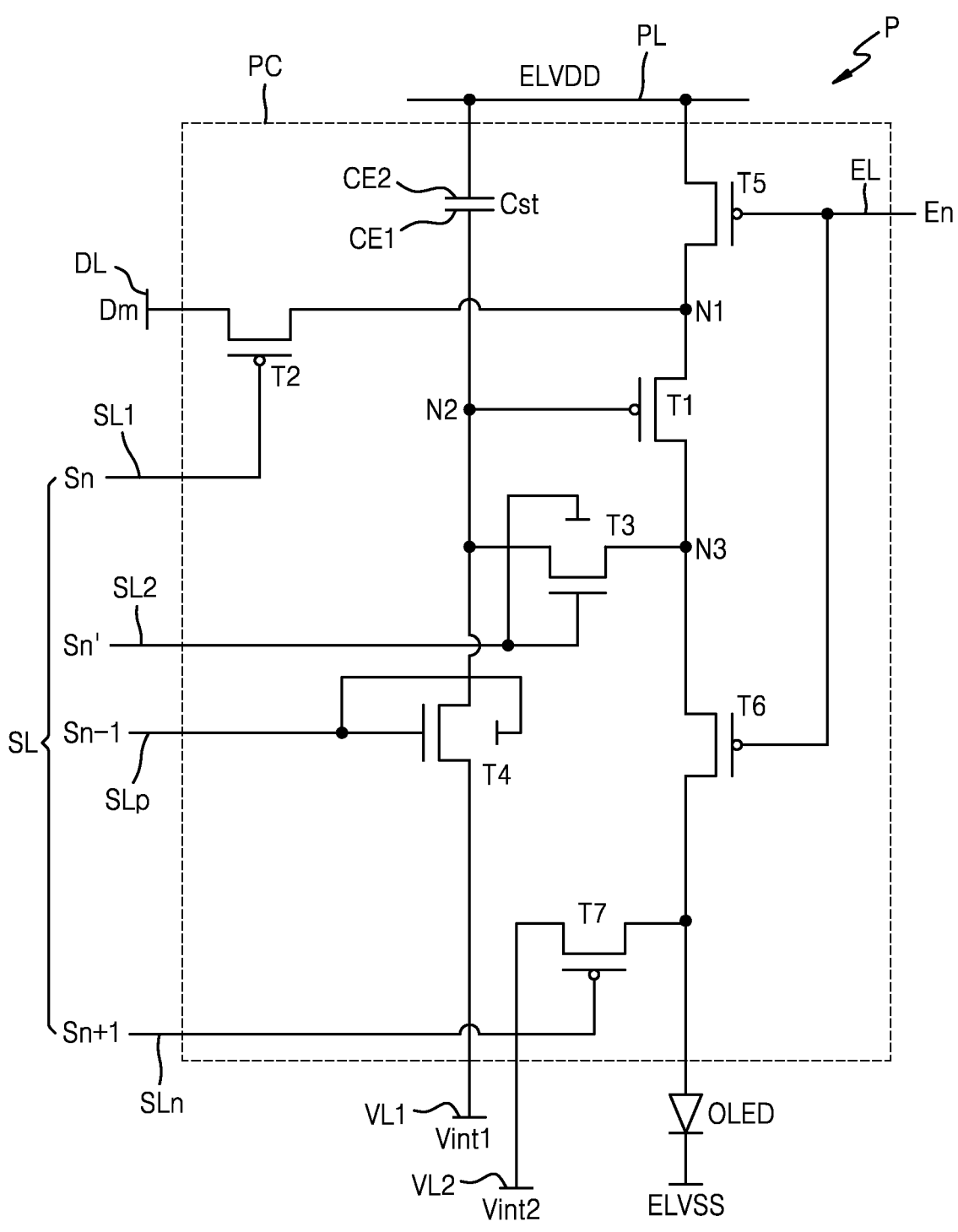
FIG. 3 is an equivalent circuit diagram schematically indicating a light-emitting diode and a pixel circuit electrically connected thereto in a display apparatus according to an embodiment.

FIG. 3 is an equivalent circuit diagram schematically indicating a light-emitting diode and a pixel circuit electrically connected thereto in a display apparatus according to an embodiment.

As illustrated in FIG. 3, a pixel P may include a pixel circuit PC and an organic light-emitting diode OLED electrically connected thereto.

The pixel circuit PC may include a plurality of thin-film transistors T1, T2, T3, T4, T5, T6, and T7 and a storage capacitor Cst. The thin-film transistors T1, T2, T3, T4, T5, T6, and T7 and the storage capacitor Cst may be connected to signal lines SL1, SL2, SLp, SLn, EL, and DL, a first initialization voltage line VL1, a second initialization voltage line VL2, and a driving voltage line PL. At least one of these lines, for example, the driving voltage line PL may be shared by neighboring pixels P.

The thin-film transistors T1, T2, T3, T4, T5, T6, and T7 may include a driving transistor T1, a switching transistor T2, a compensation transistor T3, a first initialization transistor T4, an operation control transistor T5, an emission control transistor T6, and a second initialization transistor T7.

The organic light-emitting diode OLED may include a pixel electrode (first electrode) and an opposite electrode (second electrode). The pixel electrode (first electrode) of the organic light-emitting diode OLED may be connected to the driving transistor T1 via the emission control transistor T6 and may be configured to receive a driving current. The opposite electrode may be configured to receive a second power supply voltage ELVSS. The organic light-emitting diode OLED may be configured to emit light having a luminance corresponding to the driving current.

Some of the thin-film transistors T1, T2, T3, T4, T5, T6, and T7 may be n-channel metal-oxide silicon field effect transistor (MOSFET), that is, NMOS, and the others thereof may be p-channel MOSFET, that is, PMOS. For example, the compensation transistor T3 and the first initialization transistor T4 of the thin-film transistors T1, T2, T3, T4, T5, T6, and T7 may be NMOS, and the others thereof may be PMOS. Alternatively, the compensation transistor T3, the first initialization transistor T4, and the second initialization transistor T7 of the thin-film transistors T1, T2, T3, T4, T5, T6, and T7 may be NMOS, and the others thereof may be PMOS. Alternatively, all the thin-film transistors T1, T2, T3, T4, T5, T6, and T7 may be NMOS or PMOS. The thin-film transistors T1, T2, T3, T4, T5, T6, and T7 may include amorphous silicon or polysilicon. When necessary, the thin-film transistor, which is NMOS, may include an oxide semiconductor. Hereinafter, for convenience, a case where the compensation transistor T3 and the first initialization transistor T4 are NMOS including an oxide semiconductor and the others are PMOS will be described.

The signal lines may include a first scan line SL1 configured to transmit a first scan signal Sn, a second scan line SL2 configured to transmit a second scan signal Sn', a previous scan line SLp configured to transmit a previous scan signal Sn−1 to the first initialization transistor T4, a next scan line SLn configured to transmit a next scan signal Sn+1 to the second initialization transistor T7, an emission control line EL configured to transmit an emission control signal En to the operation control transistor T5 and the emission control transistor T6, and a data line DL crossing the first scan line SL1 and configured to transmit a data signal Dm.

The driving voltage line PL may be configured to transmit a first power supply voltage ELVDD to the driving transistor T1, the first initialization voltage line VL1 may be configured to transmit a first initialization voltage Vint1 for initializing the driving transistor T1, and the second initialization voltage line VL2 may be configured to transmit a second initialization voltage Vint2 for initializing the pixel electrode (first electrode) of the organic light-emitting diode OLED.

A driving gate electrode of the driving transistor T1 may be connected to the storage capacitor Cst through a second node N2. One of a source region and a drain region of the driving transistor T1 may be connected through a first node N1 to the driving voltage line PL via the operation control transistor T5. The other of the source region and the drain region of the driving transistor T1 may be electrically connected through a third node N3 to the pixel electrode (first electrode) of the organic light-emitting diode OLED via the emission control transistor T6. The driving transistor T1 may be configured to receive the data signal Dm according to the switching operation of the switching transistor T2 and supply the driving current to the organic light-emitting diode OLED. That is, the driving transistor T1 may be configured to control the amount of current flowing from the first node electrically connected to the driving voltage line PL to the organic light-emitting diode OLED in response to the voltage applied to the second node N2, which is changed by the data signal Dm.

A switching gate electrode of the switching transistor T2 may be connected to the first scan line SL1 configured to transmit the first scan signal Sn. One of a source region and a drain region of the switching transistor T2 may be connected to the data line DL. The other of the source region and the drain region of the switching transistor T2 may be connected to the driving transistor T1 through the first node N1 and connected to the driving voltage line PL via the operation control transistor T5. The switching transistor T2 may be configured to transmit the data signal Dm from the data line DL to the first node N1 in response to the voltage applied to the first scan line SL1. That is, the switching transistor T2 may be configured to be turned on in response to the first scan signal Sn received through the first scan line SL1 and perform a switching operation of transmitting the data signal Dm from the data line DL to the driving transistor T1 through the first node N1.

A compensation gate electrode of the compensation transistor T3 is connected to the second scan line SL2. One of a source region and a drain region of the compensation transistor T3 may be connected through the third node N3 to the first electrode of the organic light-emitting diode OLED via the emission control transistor T6. The other of the source region and the drain region of the compensation transistor T3 may be connected through the second node N2 to a first capacitor electrode CE1 of the storage capacitor Cst and the driving gate electrode of the driving transistor T1. The compensation transistor T3 may be configured to be turned on in response to the second scan signal Sn' received through the second scan line SL2 and diode-connect the driving transistor T1.

A first initialization gate electrode of the first initialization transistor T4 may be connected to the previous scan line SLp. One of a source region and a drain region of the first initialization transistor T4 may be connected to the first initialization voltage line VL1. The other of the source region and the drain region of the first initialization transistor T4 may be connected through the second node N2 to the first capacitor electrode CE1 of the storage capacitor Cst and the driving gate electrode of the driving transistor T1. The first initialization transistor T4 may be configured to apply the first initialization voltage Vint1 from the first initialization voltage line VL1 to the second node N2 in response to the voltage applied to the previous scan line SLp. That is, the first initialization transistor T4 may be configured to be turned on in response to a previous scan signal Sn−1 received through the previous scan line SLp, and perform an initialization operation of transmitting the first initialization voltage Vint1 to the driving gate electrode of the driving transistor T1 so as to initialize the voltage of the driving gate electrode of the driving transistor T1.

An operation control gate electrode of the operation control transistor T5 may be connected to the emission control line EL. One of a source region and a drain region of the operation control transistor T5 may be connected to the driving voltage line PL. The other of the source region and the drain region of the operation control transistor T5 may be connected through the first node N1 to the driving transistor T1 and the switching transistor T2.

An emission control gate electrode of the emission control transistor T6 may be connected to the emission control line EL. One of a source region and a drain region of the emission control transistor T6 may be connected through the third node N3 to the driving transistor T1 and the compensation transistor T3. The other of the source region and the drain region of the emission control transistor T6 may be electrically connected to the pixel electrode (first electrode) of the organic light-emitting diode OLED.

The operation control transistor T5 and the emission control transistor T6 may be configured to be simultaneously turned on in response to the emission control signal En received through the emission control line EL and transmit the driving voltage ELVDD to the organic light-emitting diode OLED so that a driving current flows through the organic light-emitting diode OLED.

A second initialization gate electrode of the second initialization transistor T7 may be connected to the next scan line SLn. One of a source region and a drain region of the second initialization transistor T7 may be connected to the pixel electrode (first electrode) of the organic light-emitting diode OLED. The other of the source region and the drain region of the second initialization transistor T7 may be connected to the second initialization voltage line VL2 and configured to receive the second initialization voltage Vint2. The second initialization transistor T7 may be configured to be turned on in response to the next scan signal Sn+1 received through the next scan signal SLn and initialize the pixel electrode (first electrode) of the organic light-emitting diode OLED. Thereafter, the scan line SLn may be the same as the first scan line SL1. In this case, the scan line may be configured to transmit the same electrical signal with a time difference. Therefore, the scan line may function as the first scan line SL1 and the next scan line SLn. That is, the next scan line SLn may be a first scan line of a pixel adjacent to the pixel P illustrated in FIG. 3 and electrically connected to the data line DL.

The second initialization transistor T7 may be connected to the first scan line SL1, as illustrated in FIG. 3. However, the disclosure is not limited thereto, and the second initialization transistor T7 may be connected to the emission control line EL and driven in response to the emission control signal En.

The storage capacitor Cst may include the first capacitor electrode CE1 and the second capacitor electrode CE2. The first capacitor electrode CE1 of the storage capacitor Cst is connected to the driving gate electrode of the driving transistor T1 through the second node N2, and the second capacitor electrode CE2 of the storage capacitor Cst is connected to the driving voltage line PL. The storage capacitor Cst may store electric charges corresponding to a difference between the driving gate electrode voltage of the driving transistor T1 and the first power supply voltage ELVDD.

A detailed operation of the pixel P according to an embodiment is as follows.

During an initialization period, when the previous scan signal Sn−1 is supplied through the previous scan line SLp, the first initialization transistor T4 is turned on in response to the previous scan signal Sn−1, and the driving transistor T1 is initialized by the first initialization voltage Vint1 supplied from the first initialization voltage line VL1.

During a data programming period, when the first scan signal Sn and the second scan signal Sn' are respectively supplied through the first scan line SL1 and the second scan line SL2, the switching transistor T2 and the compensation transistor T3 are respectively turned on in response to the first scan signal Sn and the second scan signal Sn'. At this time, the driving transistor T1 is diode-connected by the turned-on compensation transistor T3 and is forward biased. A compensation voltage (Dm+Vth, where Vth is a negative value) reduced from the data signal Dm supplied from the data line DL by the threshold voltage (Vth) of the driving transistor T1 is applied to the driving gate electrode G1 of the driving transistor T1. The first power supply voltage ELVDD and the compensation voltage (Dm+Vth) are applied to both ends of the storage capacitor Cst, and electric charges corresponding to the voltage difference between both ends of the storage capacitor Cst are stored in the storage capacitor Cst.

During an emission period, the operation control transistor T5 and the emission control transistor T6 are turned on in response to the emission control signal En supplied from the emission control line EL. A driving current is generated according to a voltage difference between the voltage of the driving gate electrode G1 of the driving transistor T1 and the first power supply voltage ELVDD, and the driving current is supplied to the organic light-emitting diode OLED through the emission control transistor T6.

As described above, some of the thin-film transistors T1 to T7 may include an oxide semiconductor. For example, the compensation transistor T3 and the first initialization transistor T4 may include an oxide semiconductor.

In the case of polysilicon, because polysilicon has high reliability, it is possible to precisely control intended current to flow. Therefore, the driving transistor T1 that directly influences the brightness of the display apparatus is configured to include a semiconductor layer including polysilicon having high reliability, and thus, a high-resolution display apparatus may be implemented. On the other hand, because the oxide semiconductor has high carrier mobility and low leakage current, the voltage drop is not great even when the driving time is long. That is, in the case of the oxide semiconductor, low-frequency driving is possible because the color change of the image according to the voltage drop is not great even during low-frequency driving. Accordingly, because the compensation transistor T3 and the first initialization transistor T4 include the oxide semiconductor, a display apparatus in which the occurrence of leakage current is prevented and the power consumption is reduced may be implemented.

On the other hand, the oxide semiconductor is sensitive to light, and thus, the amount of current or the like may be changed due to light from the outside. Accordingly, light from the outside may be absorbed or reflected by disposing a metal layer under the oxide semiconductor. Accordingly, as illustrated in FIG. 3, the gate electrodes of the compensation transistor T3 and the first initialization transistor T4 including the oxide semiconductor may be disposed above and under the oxide semiconductor layer, respectively. That is, when viewed from a plan (the z-direction) perpendicular to the upper surface of the substrate 100, the metal layer disposed under the oxide semiconductor may overlap the oxide semiconductor.

The disclosure is not limited to the number and circuit design of the thin-film transistors and the storage capacitor described with reference to FIG. 3, and the number and circuit design of the thin-film transistors and the storage capacitor may be variously changed.

Figure 4:
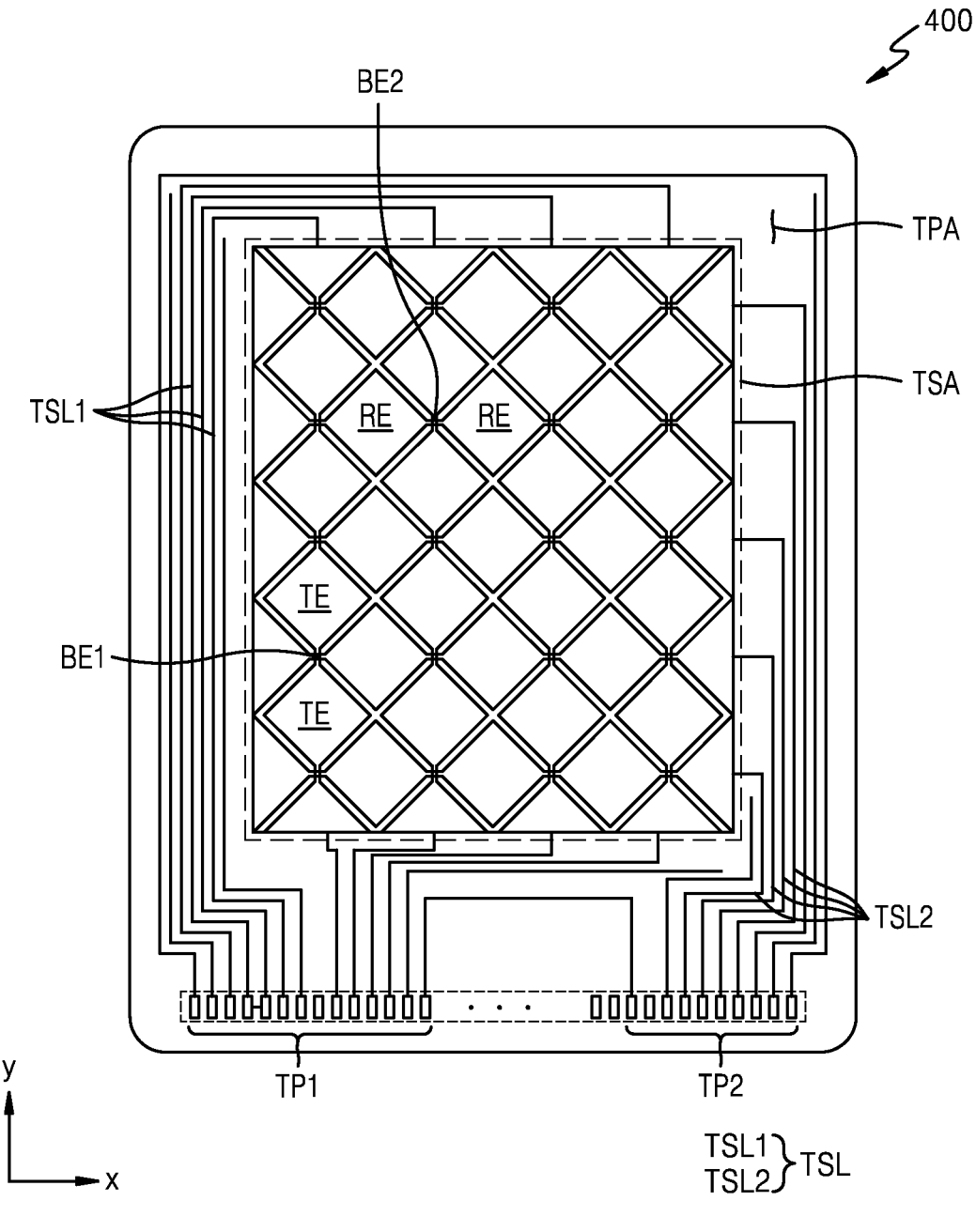
FIG. 4 is a plan view illustrating an input sensing layer of a display apparatus according to an embodiment.

FIG. 4 is a plan view illustrating an input sensing layer 400 of a display apparatus according to an embodiment.

Referring to FIG. 4, the input sensing layer 400 includes a touch sensing area TSA configured to sense a user touch and a touch peripheral area TPA disposed around the touch sensing area TSA. The touch sensing area TSA may overlap the display area (see DA of FIG. 1) of the substrate (see 100 of FIG. 1), and the touch peripheral area TPA may overlap the peripheral area (see PA of FIG. 1) of the substrate (see 100 of FIG. 1).

Each of driving electrodes TE and sensing electrodes RE may have a rhombus planar shape, but is not limited thereto. For example, each of the driving electrodes TE and the sensing electrodes RE may have a mesh structure or a net structure having a plurality of openings in a plan view.

The driving electrodes TE may be arranged in the y-direction), and the driving electrodes TE adjacent to each other in the y-direction may be electrically connected to each other. The sensing electrodes RE may be arranged in the x-direction crossing the y-direction, and the sensing electrodes RE adjacent to each other in the x-direction may be electrically connected to each other.

The driving electrodes TE and the sensing electrodes RE may be spaced apart from each other. At points where the driving electrodes TE adjacent to each other in the y-direction intersect the sensing electrodes RE adjacent to each other in the x-direction, the driving electrodes TE adjacent to each other in the y-direction may be connected to each other through first touch connection electrodes BE1, and the sensing electrodes RE adjacent to each other in the x-direction) may be connected to each other through second touch connection electrodes BE2.

An input sensing line TSL may be arranged in the touch peripheral area TPA. The driving electrodes TE of the touch sensing area TSA may be connected to first input sensing pads TP1 through first input sensing lines TSL1. The sensing electrodes RE of the touch sensing area TSA may be connected to second input sensing pads TP2 through second input sensing lines TSL2. Some of the first input sensing lines TSL1 and the second input sensing lines TSL2 may be a ground wiring or guide wirings, which is not connected to the driving electrodes TE and the sensing electrodes RE.

Figure 5:
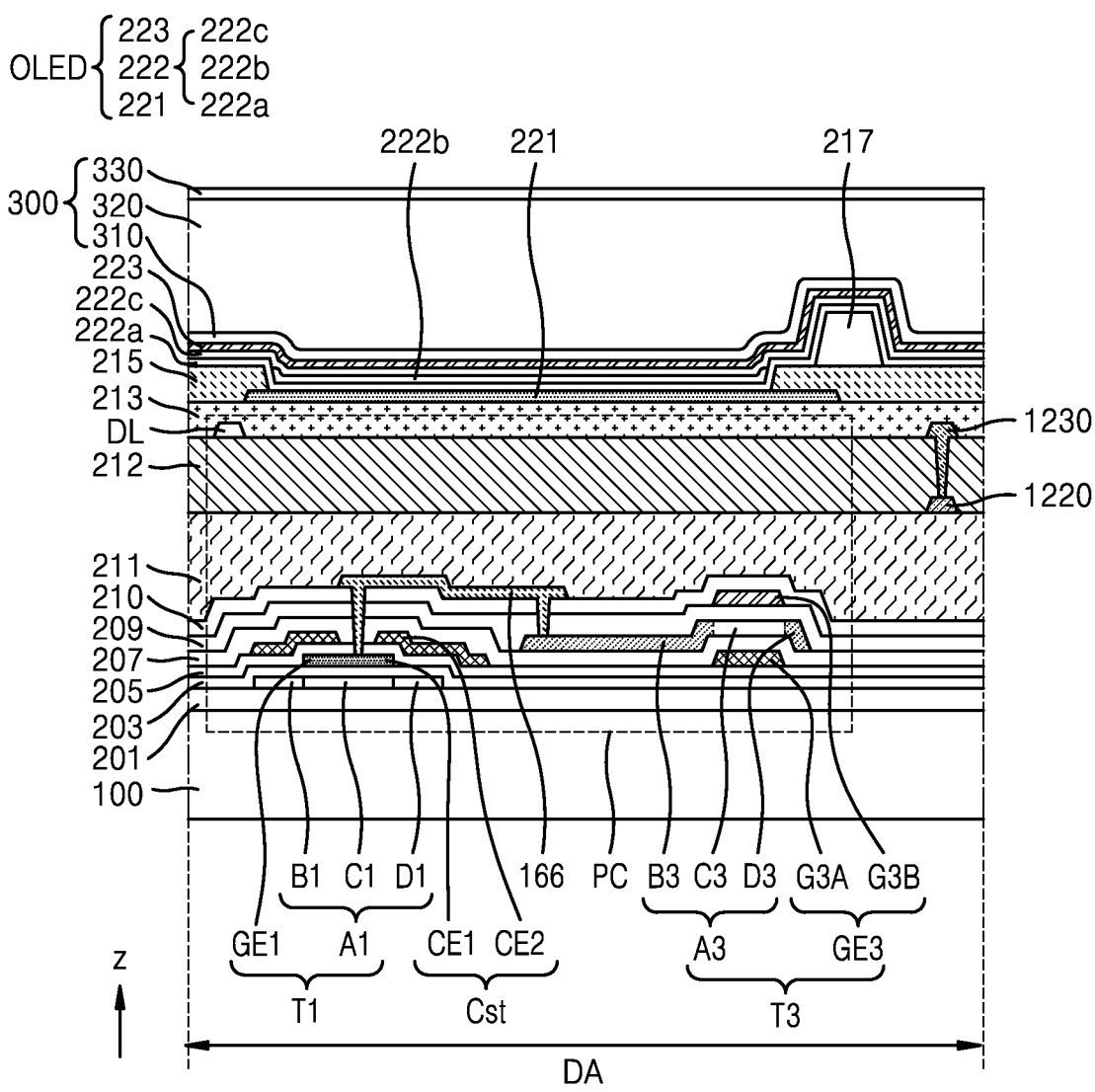
FIG. 5 is a cross-sectional view schematically illustrating a portion of a display area in a display apparatus according to an embodiment.

FIG. 5 is a cross-sectional view schematically illustrating a portion of a display area in a display apparatus according to an embodiment.

Referring to FIG. 5, an organic light-emitting diode OLED is arranged in a display area DA, and the organic light-emitting diode OLED is electrically connected to a pixel circuit PC between a substrate 100 and the organic light-emitting diode OLED.

The substrate 100 may include glass or polymer resin. In an embodiment, the substrate 100 may have a structure in which a base layer including polymer resin and a barrier layer including an inorganic insulating material, such as silicon oxide ($SiO_x$) or silicon nitride ($SiN_x$), are alternately stacked. The polymer resin may include polymer resin selected from polyethersulfone, polyarylate, polyether imide, polyethylene naphthalate, polyethylene terephthalate, polyphenylene sulfide, polyimide, polycarbonate, cellulose triacetate, and cellulose acetate propionate.

A buffer layer 201 may be formed on the substrate 100 before the pixel circuit PC is formed. The buffer layer 201 may include an inorganic insulating material, such as silicon nitride ($SiN_x$), silicon oxynitride (SiON), or silicon oxide ($SiO_x$), and may include a single layer or layers including the inorganic insulating material described above. The buffer layer 201 may prevent diffusion of metal atoms or impurities from the substrate 100 to a driving semiconductor layer A1 disposed thereon.

The pixel circuit PC may include a plurality of transistors and a storage capacitor, as described above with reference to FIG. 3. In this regard, FIG. 5 illustrates a driving transistor T1, a compensation transistor T3, and a storage capacitor Cst.

The driving transistor T1 may include a semiconductor layer A1 (hereinafter referred to as a driving semiconductor layer) disposed on the buffer layer 201, and a driving gate electrode GE1 overlapping a channel region C1 of the driving semiconductor layer A1. The driving semiconductor layer A1 may include a silicon-based semiconductor material, for example, polysilicon. The driving semiconductor layer A1 may include a channel region C1, and a first region B1 and a second region D1 respectively disposed on both sides of the channel region C1. The first region B1 and the second region D1 are regions including a higher concentration of impurities than the channel region C1. One of the first region B1 and the second region D1 may correspond to a source region, and the other thereof may correspond to a drain region.

A first gate insulating layer 203 may be disposed between the driving semiconductor layer A1 and the driving gate electrode GE1. The first gate insulating layer 203 may include an inorganic insulating material, such as silicon oxide ($SiO_x$), silicon nitride ($SiN_x$), or silicon oxynitride (SiON), and may include a single-layer or multilayer structure including the inorganic insulating material described above.

The driving gate electrode GE1 may include a conductive material including molybdenum (Mo), aluminum (Al), copper (Cu), titanium (Ti), and the like, and may include a single layer or layers including the conductive material described above.

The storage capacitor Cst may include a first capacitor electrode CE1 and a second capacitor electrode CE2 overlapping each other. In an embodiment, the first capacitor electrode CE1 of the storage capacitor Cst may include the driving gate electrode GE1. In other words, the driving gate electrode GE1 may include the first capacitor electrode CE1 of the storage capacitor Cst. For example, the driving gate electrode GE1 and the first capacitor electrode CE1 of the storage capacitor Cst may be integrally formed as a single body.

A second gate insulating layer 205 may be disposed between the first capacitor electrode CE1 and the second capacitor electrode CE2 of the storage capacitor Cst. The first capacitor electrode CE1 and the second capacitor electrode CE2 are spaced apart from each other with respect to the second gate insulating layer 205 therebetween. The second gate insulating layer 205 may include an inorganic insulating material, such as silicon oxide ($SiO_x$), silicon nitride ($SiN_x$), or silicon oxynitride (SiON), and may include a single-layer or multilayer structure including the inorganic insulating material described above.

The second capacitor electrode CE2 of the storage capacitor Cst may include a low-resistance conductive material, such as molybdenum (Mo), aluminum (Al), copper (Cu), and/or titanium (Ti), and may include a single-layer or multilayer structure including the low-resistance conductive material described above. A hole passing through the second capacitor electrode CE2 may be formed in the second capacitor electrode CE2, and at least a portion of the driving gate electrode GE1 may overlap the hole.

A first interlayer insulating layer 207 may be disposed on the storage capacitor Cst. The first interlayer insulating layer 207 may include an inorganic insulating material, such as silicon oxide ($SiO_x$), silicon nitride ($SiN_x$), or silicon oxynitride (SiON), and may include a single-layer or multilayer structure including the inorganic insulating material described above.

A semiconductor layer A3 (hereinafter referred to as a compensation semiconductor layer) of the compensation transistor T3 may be disposed on the first interlayer insulating layer 207. The compensation semiconductor layer A3 may include an oxide-based semiconductor material. For example, the compensation semiconductor layer A3 may include a Zn oxide-based material, for example, Zn oxide, In—Zn oxide, Ga—In—Zn oxide, or the like. In some embodiments, the compensation semiconductor layer A3 may include In—Ga—Zn—O (IGZO), In—Sn—Zn—O (ITZO), or In—Ga—Sn—Zn—O (IGTZO) semiconductor, in which a metal, such as indium (In), gallium (Ga), or tin (Sn), is included in ZnO.

The compensation semiconductor layer A3 may include a channel region C3, and a first region B3 and a second region D3 respectively on both sides of the channel region C3. One of the first region B3 and the second region D3 may be a source region, and the other thereof may be a drain region.

The compensation transistor T3 may include a compensation gate electrode GE3 overlapping the channel region C3 of the compensation semiconductor layer A3. The compensation gate electrode GE3 may have a double gate structure including a lower gate electrode G3A disposed under the compensation semiconductor layer A3 and an upper gate electrode G3B above the channel region C3.

The lower gate electrode G3A may be disposed on the same layer (e.g., the second gate insulating layer 205) as the second capacitor electrode CE2 of the storage capacitor Cst. The lower gate electrode G3A may include the same material as that of the second capacitor electrode CE2 of the storage capacitor Cst.

The upper gate electrode G3B may be disposed on the compensation semiconductor layer A3 with respect to a third gate insulating layer 209 therebetween. The third gate insulating layer 209 may include an inorganic insulating material, such as silicon oxide ($SiO_x$), silicon nitride ($SiN_x$), or silicon oxynitride (SiON), and may include a single-layer or multilayer structure including the inorganic insulating material described above. The third gate insulating layer 209 may be in contact with a portion of the compensation semiconductor layer A3 and may not be in contact with the first interlayer insulating layer 207. In this case, the third gate insulating layer 209 may overlap the upper gate electrode G3B when viewed from a plan view (z-direction) substantially perpendicular to the upper surface of the substrate 100. The third gate insulating layer 209 may be patterned simultaneously with the upper gate electrode G3B.

The second interlayer insulating layer 210 may be disposed on the upper gate electrode G3B. The second interlayer insulating layer 210 may include an inorganic insulating material, such as silicon oxide ($SiO_x$), silicon nitride ($SiN_x$), or silicon oxynitride (SiON), and may include a single-layer or multilayer structure including the inorganic insulating material described above.

The driving transistor T1 and the compensation transistor T3 may be electrically connected to each other through a node connection line 166. The node connection line 166 may be disposed on the second interlayer insulating layer 210. One side of the node connection line 166 may be connected to the driving gate electrode GE1 of the driving transistor T1, and the other side of the node connection line 166 may be connected to the compensation semiconductor layer A3 (the first region B3) of the compensation transistor T3.

The node connection line 166 may include aluminum (Al), copper (Cu), and/or titanium (Ti), and may include a single layer or layers including the material described above. For example, the node connection line 166 may have a three-layer structure including a titanium layer, an aluminum layer, and a titanium layer.

A first planarization layer 211 may cover the node connection line 166 and may be disposed on the second interlayer insulating layer 210. The first planarization layer 211 may include an organic insulating material. The organic insulating material may include photoresist, benzocyclobutene (BCB), polyimide, hexamethyldisiloxane (HMDSO), polymethylmethacrylate (PMMA), polystyrene, polymer derivatives having a phenolic group, acrylic polymer, imide-based polymer, aryl ether-based polymer, amide-based polymer, fluorine-based polymer, p-xylene-based polymer, vinyl alcohol-based polymer, or/or any mixture thereof.

A first signal line 1220 may be disposed on the first planarization layer 211. The first signal line 1220 may include aluminum (Al), copper (Cu), and/or titanium (Ti), and may include a single layer or layers including the material described above. For example, the first signal line 1220 may have a three-layer structure including a titanium layer, an aluminum layer, and a titanium layer.

A second planarization layer 212 may be disposed on the first signal line 1220. The second planarization layer 212 may include an organic insulating material. The organic insulating material may include photoresist, BCB, polyimide, HMDSO, PMMA, polystyrene, polymer derivatives having a phenolic group, acrylic polymer, imide-based polymer, aryl ether-based polymer, amide-based polymer, fluorine-based polymer, p-xylene-based polymer, vinyl alcohol-based polymer, or/or any mixture thereof. A data line DL and a second signal line 1230 may be disposed on the second planarization layer 212.

The data line DL and the second signal line 1230 may include aluminum (Al), copper (Cu), and/or titanium (Ti), and may include a single layer or layers including the material described above. For example, the data line DL and the second signal line 1230 may have a three-layer structure including a titanium layer, an aluminum layer, and a titanium layer.

In an embodiment, the first signal line 1220 and the second signal line 1230 may be configured to supply a driving current, a second initialization voltage (see Vint2 of FIG. 3), or a second power supply voltage (see ELVSS of FIG. 3). The first signal line 1220 and the second signal line 1230 may be electrically connected to each other. For example, the first signal line 1220 may be electrically connected to the second signal line 1230 through a contact hole passing through the second planarization layer 212.

A third planarization layer 213 may be disposed on the data line DL and the second signal line 1230. The third planarization layer 213 may include an organic insulating material. The organic insulating material may include photoresist, BCB, polyimide, HMDSO, PMMA, polystyrene, polymer derivatives having a phenolic group, acrylic polymer, imide-based polymer, aryl ether-based polymer, amide-based polymer, fluorine-based polymer, p-xylene-based polymer, vinyl alcohol-based polymer, or/or any mixture thereof.

A light-emitting diode, for example, an organic light-emitting diode (OLED) may be disposed on the third planarization layer 213. A pixel electrode 221 of the organic light-emitting diode OLED may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In another embodiment, the pixel electrode 221 may further include a conductive oxide layer above and/or under the reflective layer. The conductive oxide layer may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the pixel electrode 221 may have a three-layer structure including an ITO layer, an Ag layer, and an ITO layer.

A bank layer 215 may be disposed on the pixel electrode 221 and the third planarization layer 213. An opening overlapping the pixel electrode 221 may be defined in the bank layer 215, and the bank layer 215 may cover an edge of the pixel electrode 221. The bank layer 215 may include at least one organic insulating material selected from polyimide, polyamide, acrylic resin, BCB, and phenol resin.

At least a portion of an intermediate layer 222 of the organic light-emitting diode OLED may be located in the opening formed by the bank layer 215. An emission area EA of the organic light-emitting diode OLED may be defined by the opening.

The intermediate layer 222 includes an emission layer 222b. The emission layer 222b may include an organic material including a fluorescent or phosphorescent material that emits red light, green light, blue light, or white light. The emission layer 222b may include a low molecular weight organic material or a high molecular weight organic material. A first functional layer 222a and/or a second functional layer, such as a hole transport layer (HTL), a hole injection layer (HIL), an electron transport layer (ETL), and an electron injection layer (EIL), may be optionally further disposed under and above the emission layer 222b.

The emission layer 222b may have a patterned shape corresponding to each of the pixel electrodes 221. Layers other than the emission layer 222b included in the intermediate layer 222 may be variously modified. For example, the layers may be integrally formed as a single body over the pixel electrodes 221.

An opposite electrode 223 may include a conductive material having a low work function. For example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 223 may further include a layer including ITO, IZO, ZnO, or $In_2O_3$ on the (semi)transparent layer including the material described above. The opposite electrode 223 may be integrally formed as a single body over the entire display area DA and cover the intermediate layer 222 and the bank layer 215.

A spacer 217 may be disposed on the bank layer 215. The spacer 217 may be formed in the same process as the bank layer 215, or may be formed separately in separate processes. In an embodiment, the spacer 217 may include an organic insulating material, such as polyimide.

The bank layer 215 and the spacer 217 may include a light blocking material and may be provided in black. The light blocking layer may include carbon black, carbon nanotubes, a resin or paste including black dye, metal particles (e.g., nickel, aluminum, molybdenum, and any alloy thereof), metal oxide particles (e.g., chromium oxide), or metal nitride particles (e.g., chromium nitride). When the bank layer 215 includes a light blocking material, the reflection of external light due to the metal structures below the bank layer 215 may be reduced.

The organic light-emitting diode OLED may be covered with an encapsulation layer 300. The encapsulation layer 300 may include at least one organic encapsulation layer and at least one inorganic encapsulation layer. In an embodiment, FIG. 6 illustrates that the encapsulation layer 300 includes first and second inorganic encapsulation layers 310 and 330 and an organic encapsulation layer 320 disposed therebetween.

The first inorganic encapsulation layer 310 and the second inorganic encapsulation layer 330 may include at least one inorganic material selected from aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may be a single layer or layers including the inorganic material described above. The organic encapsulation layer 320 may include a polymer-based material. The polymer-based material may include acrylic resin, epoxy-based resin, polyimide, polyethylene, and the like. In an embodiment, the organic encapsulation layer 320 may include acrylate.

Figure 6:
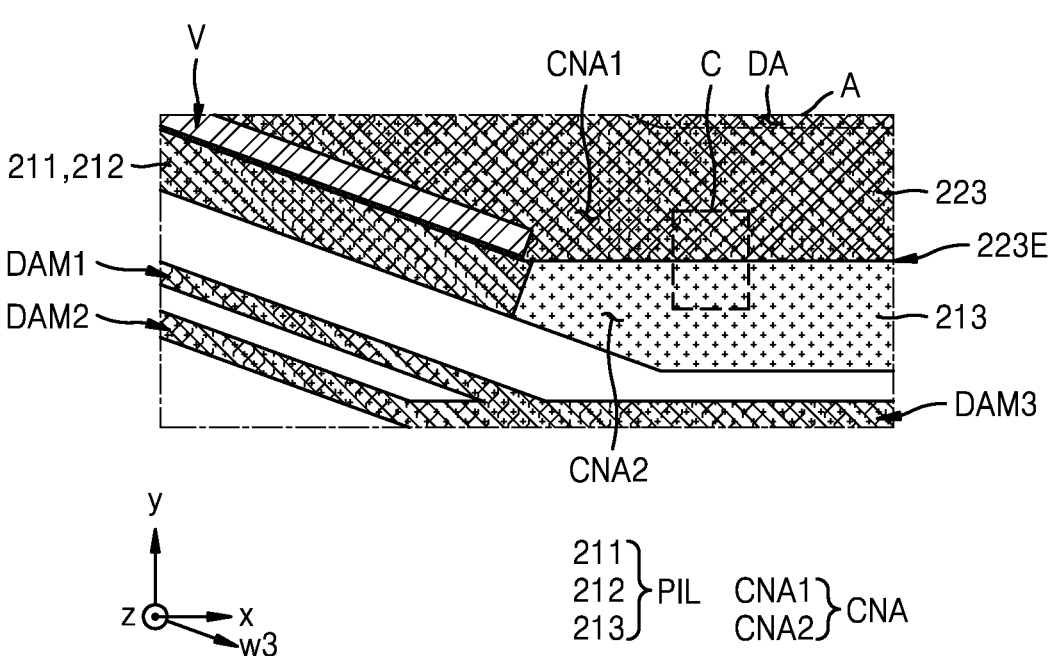
FIG. 6 is an enlarged plan view schematically illustrating a portion of a corner area in a display apparatus according to an embodiment.

FIG. 6 is an enlarged plan view schematically illustrating a portion of a corner area in a display apparatus according to an embodiment. That is, FIG. 6 is an enlarged view of the corner area CNA in the display apparatus illustrated in FIG. 1, and schematically illustrates the first planarization layer 211, the second planarization layer 212, the third planarization layer 213, and the opposite electrode 223.

Referring to FIG. 6, a first dam DAM1, a second dam DAM2, and a third dam DAM3 surrounding at least a portion of the display area DA may be arranged in the corner area CNA. The first dam DAM1 and the second dam DAM2 may have a loop shape with one side open so as to surround at least a portion of the display area DA. The third dam DAM3 may extend in the x direction from the first dam DAM1 and the second dam DAM2. That is, the first dam DAM1 and the second dam DAM2 are connected to one end of the third dam DAM3. The first dam DAM1, the second dam DAM2, and the third dam DAM3 may include at least one organic layer. The first dam DAM1, the second dam DAM2, and the third dam DAM3 may include the same material as that of at least one of the first planarization layer 211, the second planarization layer 212, the third planarization layer 213, the bank layer 215, and the spacer 217 of the display area (see DA of FIG. 5). In the present specification, the expression A and B include the same material as each other may mean that A and B are simultaneously formed through the same process. The first dam DAM1, the second dam DAM2, and the third dam DAM3 may be configured to control the flow of monomers forming the organic encapsulation layer (see 320 of FIG. 5) of the encapsulation layer (see 300 of FIG. 5).

A planarization layer PIL is arranged in the corner area CNA inside the first dam DAM1, the second dam DAM2, and the third dam DAM3. The planarization layer PIL may include the first planarization layer (see 211 of FIG. 5), the second planarization layer (see 212 of FIG. 5), and the third planarization layer (see 213 of FIG. 5) of the display area DA, which extend to the peripheral area PA and are sequentially stacked in this stated order. An opening surrounding at least a portion of the display area DA may be formed in each of the first planarization layer (see 211 of FIG. 5), the second planarization layer (see 212 of FIG. 5), and the third planarization layer (see 213 of FIG. 5), respectively. The opening of the first planarization layer (see 211 of FIG. 5), the opening of the second planarization layer (see 212 of FIG. 5), and the opening of the third planarization layer (see 213 of FIG. 5) may overlap each other and form a valley portion V, when viewed from a direction substantially perpendicular to the upper surface of the substrate 100. The valley portion V may have a loop shape in which one side surrounding at least a portion of the display area DA is opened. Because all or at least a portion of the first planarization layer (see 211 of FIG. 5), the second planarization layer (see 212 of FIG. 5), and the third planarization layer (see 213 of FIG. 5) each of which has an organic material are removed from the valley portion V, a path through which impurities, such as moisture, penetrate into the display area DA from the outside of the substrate 100 may be blocked or reduced. In the corner area CNA, the valley portion V may extend in a third direction w3 crossing the y-direction and the x-direction.

An end 223E of the opposite electrode 223 may be adjacent to the valley portion V and extend in a w3-direction as shown in FIG. 6. In this regard, FIG. 6 illustrates that the end 223E of the opposite electrode 223 is disposed outside the valley portion V so that the opposite electrode 223 covers the valley portion V. In an embodiment, the end 223E of the opposite electrode 223 may be disposed inside the valley portion V so that the opposite electrode 223 does not overlap the valley portion V.

The end 223E of the opposite electrode 223 may extend in the x-direction from the point where the valley portion V ends. A first corner area CNA1 and a second corner area CNA2 may be defined based on the end 223E of the opposite electrode 223 extending in the x-direction. The first corner area CNA1 may overlap the opposite electrode 223, and the second corner area CNA2 may be outside the first corner area CNA1 so as to surround the first corner area CNA1. The second corner area CNA2 may not overlap the opposite electrode 223.

The first planarization layer 211, the second planarization layer 212, and the third planarization layer 213 may be disposed to overlap the first corner area CNA1. The first planarization layer 211 and the second planarization layer 212 do not overlap the second corner area CNA2, and only the third planarization layer 213 may be disposed to overlap the second corner area CNA2. Most of the first planarization layer 211 and the second planarization layer 212 may be removed from the second corner area CNA2.

Figure 7:
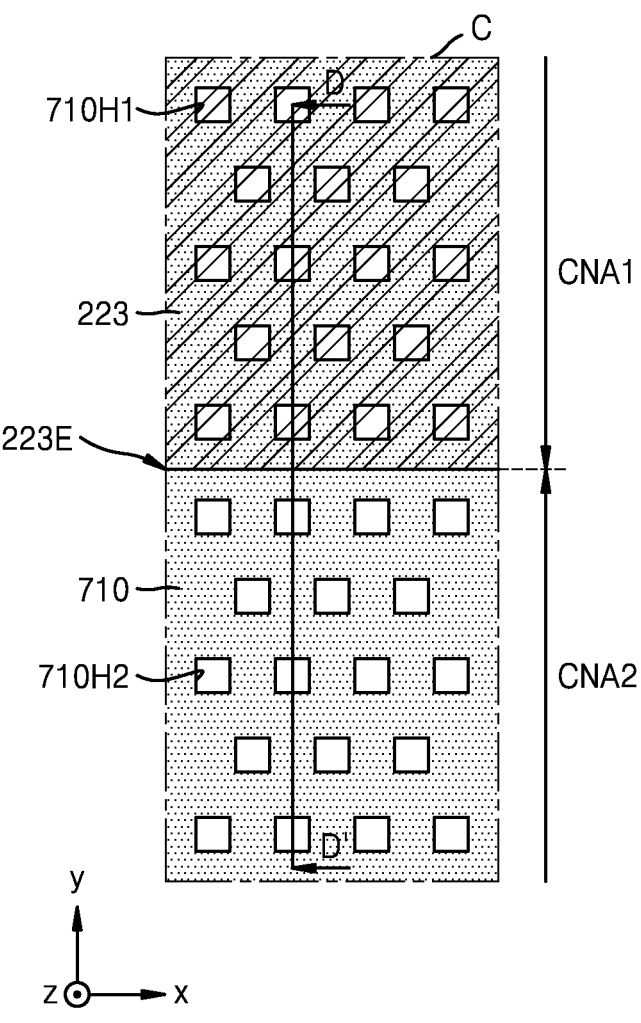
FIGS. 7 and 8 are enlarged plan views schematically illustrating a portion of a display apparatus according to an embodiment.
Figure 8:
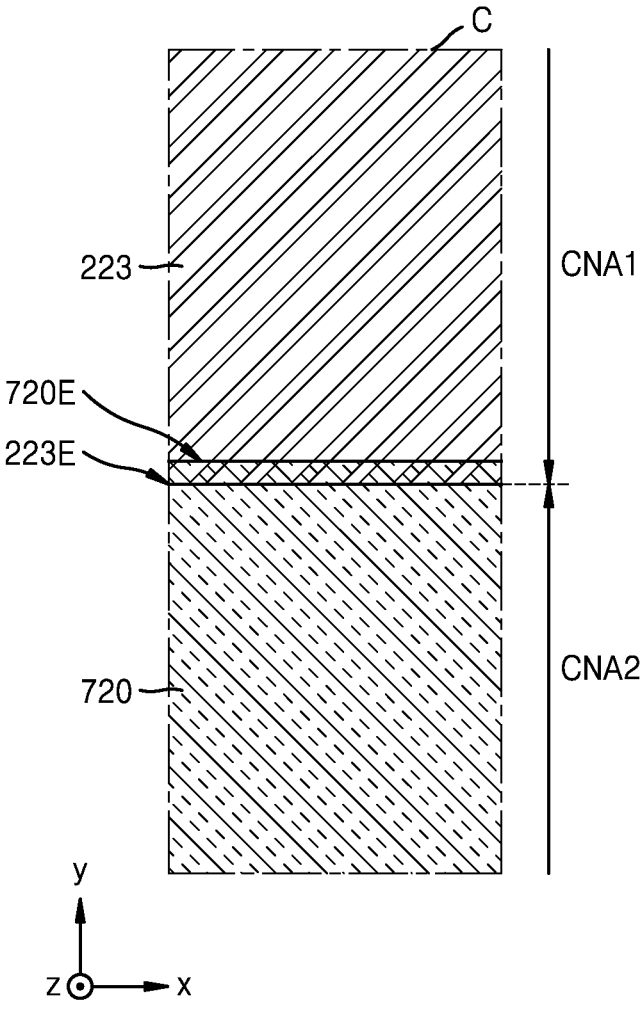
Figure 9:
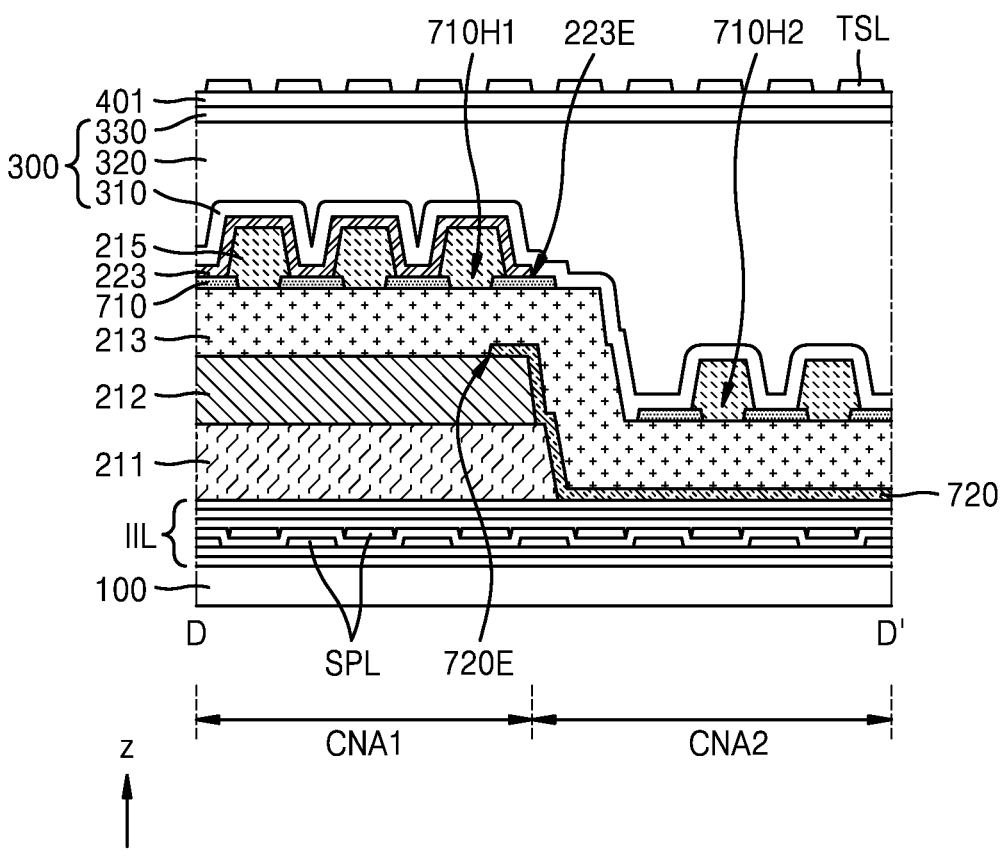
FIG. 9 is a cross-sectional view schematically illustrating a portion of the display apparatus.

FIGS. 7 and 8 are enlarged plan views schematically illustrating a portion of a display apparatus according to an embodiment, and FIG. 9 is a cross-sectional view schematically illustrating a portion of the display apparatus. FIGS. 7 and 8 are enlarged plan views illustrating region C of FIG. 6, and FIG. 9 is a cross-sectional view of the display apparatus taken along line D-D' of FIG. 7.

FIG. 7 schematically illustrates an opposite electrode 223 and a first shielding layer 710, and FIG. 8 schematically illustrates the opposite electrode 223 and a second shielding layer 720.

Referring to FIGS. 7, 8, and 9, a first corner area CNA1 and a second corner area CNA2 may be defined based on an end 223E of the opposite electrode 223. The first corner area CNA1 may overlap the opposite electrode 223, and the second corner area CNA2 may not overlap the opposite electrode 223.

One or more inorganic insulating layers IIL may be disposed on a substrate 100. Each of the one or more inorganic insulating layers IIL may include the same material as that of at least one of the buffer layer (see 201 of FIG.

5), the first gate insulating layer (see 203 of FIG. 5), the second gate insulating layer (see 205 of FIG. 5), the first interlayer insulating layer (see 207 of FIG. 5), the third gate insulating layer (see 209 of FIG. 5), and the second interlayer insulating layer (see 210 of FIG. 5) in the display area (see DA of FIG. 5).

A plurality of spider lines SPL may be disposed between the one or more inorganic insulating layers IIL. Each of the spider lines SPL may be configured to transmit a signal to the pixel circuit (see PC of FIG. 5) or the organic light-emitting diode (see OLED of FIG. 5). Each of the spider lines SPL may include the same material as that of one of the driving gate electrode (see GE1 of FIG. 5) of the driving transistor (see T1 of FIG. 5) and the lower gate electrode (see G3A of FIG. 5) and the upper gate electrode (see G3B of FIG. 5) of the compensation transistor (see T3 of FIG. 5) in the display area (see DA of FIG. 5). For example, the spider lines SPL may include lower lines disposed on the same layer as the driving gate electrode GE1 and upper lines disposed on the same layer as the lower gate electrode G3A.

A first planarization layer 211 overlaps the first corner area CNA1 and is disposed on the one or more inorganic insulating layers IIL, and a second planarization layer 212 overlaps the first corner area CNA1 and is disposed on the first planarization layer 211. Ends of the first planarization layer 211 and the second planarization layer 212 may be adjacent to the end 223E of the opposite electrode 223. Accordingly, the first planarization layer 211 and the second planarization layer 212 may not overlap all or most of the second corner area CNA2.

The third planarization layer 213 may be integrally formed as a single body so as to cover the first corner area CNA1 and the second corner area CNA2. In the first corner area CNA1, the third planarization layer 213 may be disposed on the second planarization layer 212.

A first shielding layer 710 may be disposed on the third planarization layer 213. The first shielding layer 710 may be disposed to overlap the first corner area CNA1 and the second corner area CNA2. A plurality of (1-1)th holes 710H1 overlapping the first corner area CNA1 may be formed in the first shielding layer 710 and spaced apart from each other, and a plurality of (1-2)th holes 710H2 overlapping the second corner area CNA2 may be formed in the first shielding layer 710 and spaced apart from each other.

The (1-1)th holes 710H1 and the (1-2)th holes 710H2 may function as a path configured to discharge gas generated in organic layers under the first shielding layer 710. For example, the (1-1)th holes 710H1 may be configured to discharge gas generated in the first planarization layer 211, the second planarization layer 212, and the third planarization layer 213 disposed under the first shielding layer 710 in the first corner area CNA1. The (1-2)th holes 710H2 may be configured to discharge gas generated in the third planarization layer 213 under the first shielding layer 710 in the second corner area CNA2.

The first shielding layer 710 may include the same material as that of the pixel electrode (see 221 of FIG. 5) in the display area (see DA of FIG. 5). For example, the first shielding layer 710 may be formed during a process of patterning the pixel electrode (see 221 of FIG. 5).

A second shielding layer 720 may be disposed to overlap the second corner area CNA2. The second shielding layer 720 may be disposed on the inorganic insulating layer IIL in the second corner area CNA2. The second shielding layer 720 may not overlap the opposite electrode 223, or may partially overlap the opposite electrode 223. For example, an end 720E of the second shielding layer 720 may coincide with the end 223E of the opposite electrode 223, or may be inside the end 223E of the opposite electrode 223. The inside of the end 223E of the opposite electrode 223 refers to a side close to the display area (see DA of FIG. 1) of the substrate 100. The second shielding layer 720 may not overlap the first corner area CNA1, or may cover only a partial area adjacent to the boundary of the first corner area CNA1. Accordingly, gas generated from the first planarization layer 211 and the second planarization layer 212 overlapping the first corner area CNA1 may be easily discharged through the (1-1)th holes 710H1 of the first shielding layer 710.

The second shielding layer 720 may include the same material as those of the data line (see DL of FIG. 5) and the second signal line (see 1230 of FIG. 5) in the display area (see DA of FIG. 5). For example, the second shielding layer 720 may be formed during a process of patterning the data line DL and the second signal line 1230.

In the second corner area CNA2, the second shielding layer 720 may be in direct contact with the upper surface of the inorganic insulating layer IL. In the second corner area CNA2, there is no or a very small amount of an organic material generating gas between the second shielding layer 720 and the upper surface of the inorganic insulating layer IIL, and thus, the second shielding layer 720 may cover the entire surface of the second corner area CNA2. For example, the second shielding layer 720 may not include a through hole overlapping the second corner area CNA2.

A bank layer 215 may be disposed on the third planarization layer 213 and the first shielding layer 710. The bank layer 215 may have a mesh shape with a through hole, when viewed from a direction substantially perpendicular to the upper surface of the substrate 100. The bank layer 215 on the first corner area CNA1 and the second corner area CNA2 may be omitted.

The opposite electrode 223 may be disposed on the bank layer 215 and the first shielding layer 710 and overlap the first corner area CNA1. The opposite electrode 223 may extend from the display area (see DA of FIG. 1) to the first corner area CNA1 and may be integrally formed a single body. When viewed from a direction substantially perpendicular to the upper surface of the substrate 100, the opposite electrode 223 may cover the first corner area CNA1. Because the opposite electrode 223 does not have an opening or a through hole, the opposite electrode 223 may cover the first corner area CNA1 exposed by the (1-1)th holes 710H passing through the first shielding layer 710.

An encapsulation layer 300 may be disposed on the opposite electrode 223 and the bank layer 215. The encapsulation layer 300 may extend from the display area (see DA of FIG. 1) to the second corner area CNA2 through the first corner area CNA1. As described above, the encapsulation layer 300 may include at least one inorganic encapsulation layer and at least one organic encapsulation layer. In this regard, FIG. 9 illustrates that the encapsulation layer 300 includes a first inorganic encapsulation layer 310, a second inorganic encapsulation layer 330, and an organic encapsulation layer 320 disposed between the first inorganic encapsulation layer 310 and the second inorganic encapsulation layer 330.

A first touch insulating layer 401 may be disposed on the encapsulation layer 300. The first touch insulating layer 401 may be an insulating layer that provides a base surface of the input sensing layer (see 400 of FIG. 4). The first touch insulating layer 401 may include an inorganic material or a composite material. The first touch insulating layer 401 may include at least one selected from aluminum oxide ($Al_2O_3$), titanium oxide ($TiO_2$), silicon oxide ($SiO_x$), silicon oxynitride (SiON), silicon nitride ($SiN_x$), zirconium oxide ($ZrO_2$), and hafnium oxide ($HfO_2$). The first touch insulating layer 401 may be replaced with an organic insulating layer.

An input sensing line TSL may be disposed on the first touch insulating layer 401. As described above, the input sensing line TSL may be arranged in the touch peripheral area (see TPA of FIG. 4), and the touch peripheral area TPA may overlap the first corner area CNA1 and the second corner area CNA2 of the substrate 100. In the first corner area CNA1 and the second corner area CNA2, the input sensing line TSL may be disposed to overlap a spider line SPL. As the input sensing line TSL and the spider line SPL overlap each other in a plan view, a coupling effect may cause noise to occur in an electrical signal transmitted through the input sensing line TSL or may cause noise to occur in an electrical signal transmitted through the spider line SPL. In the case of the display apparatus according to embodiments, when viewed from a direction substantially perpendicular to the substrate 100, the first corner area CNA1 is covered with the first shielding layer 710 and the opposite electrode 223, and the second corner area CNA2 is covered with the first shielding layer 710 and the second shielding layer 720. Accordingly, the occurrence of the coupling effect between the input sensing line TSL and the spider line SPL may be prevented or minimized.

Figure 10:
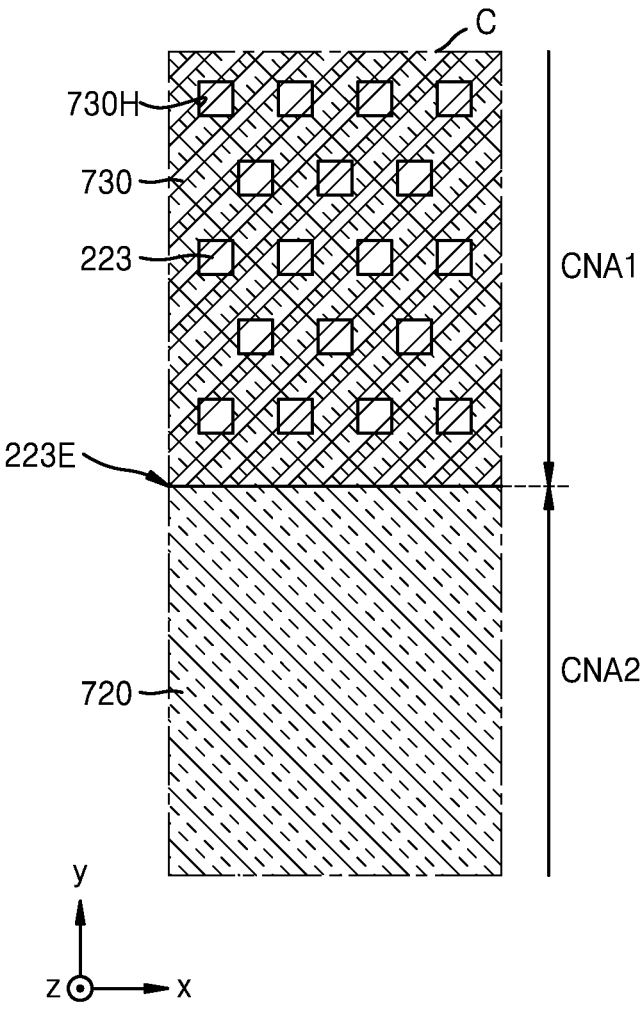
FIG. 10 is an enlarged plan view schematically illustrating a portion of a display apparatus according to an embodiment.
Figure 11:
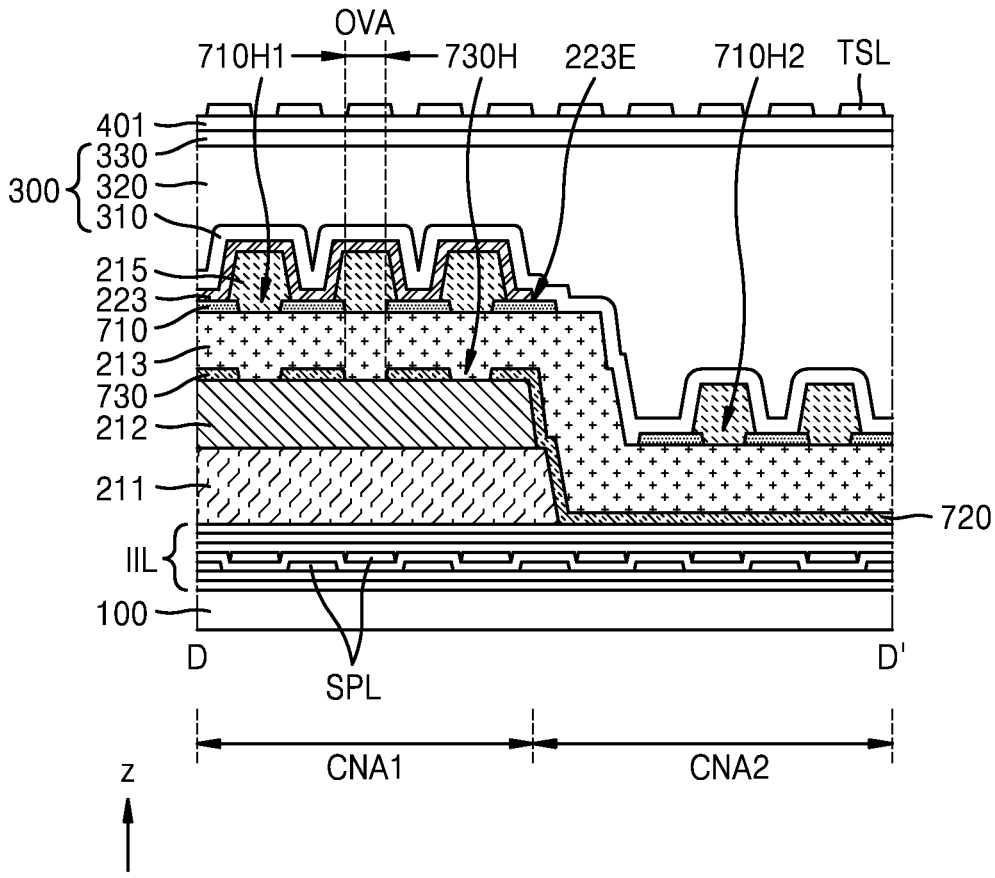
FIG. 11 is a cross-sectional view schematically illustrating a portion of the display apparatus.

FIG. 10 is an enlarged plan view schematically illustrating a portion of a display apparatus according to an embodiment, and FIG. 11 is a cross-sectional view schematically illustrating a portion of the display apparatus. FIG. 10 is an enlarged plan view illustrating region C of the display apparatus illustrated in FIG. 6, and FIG. 11 is a cross-sectional view of the display apparatus taken along line D-D' of FIG. 7. FIGS. 10 and 11 are similar to FIGS. 8 and 9, respectively, but differ from FIGS. 8 and 9 in that the display apparatus further includes a third shielding layer 730 overlapping a first corner area CNA1. Hereinafter, descriptions of the same or similar components will be omitted, and differences will be mainly described.

Referring to FIGS. 10 and 11, a first corner area CNA1 and a second corner area CNA2 may be defined based on an end 223E of an opposite electrode 223. The first corner area CNA1 may overlap the opposite electrode 223, and the second corner area CNA2 may not overlap the opposite electrode 223.

A first shielding layer 710 may be disposed on a third planarization layer 213 and overlap the first corner area CNA1 and the second corner area CNA2. A plurality of (1-1)th holes 710H1 overlapping the first corner area CNA1 may be formed in the first shielding layer 710 and spaced apart from each other, and a plurality of (1-2)th holes 710H2 overlapping the second corner area CNA2 may be formed in the first shielding layer 710 and spaced apart from each other.

A second shielding layer 720 may be disposed on an inorganic insulating layer IIL and overlap the second corner area CNA2. The second shielding layer 720 may not overlap the opposite electrode 223, or may partially overlap the opposite electrode 223. A through hole overlapping the second corner area CNA2 may not be formed in the second shielding layer 720. That is, when viewed from a direction substantially perpendicular to the upper surface of the substrate 100, the second shielding layer 720 may cover the entire surface of the second corner area CNA2.

A third shielding layer 730 may be further disposed under the first shielding layer 710 and overlap the first corner area CNA1. In this regard, FIG. 11 illustrates that the third shielding layer 730 is between the second planarization layer 212 and the third planarization layer 213. The third shielding layer 730 may include the same material as those of the data line (see DL of FIG. 5) and the second signal line (see 1230 of FIG. 5) in the display area (see DA of FIG. 5). For example, the third shielding layer 730 may be formed during a process of patterning the data line (see DL of FIG. 5) and the second signal line (see 1230 of FIG. 5). The third shielding layer 730 may be integrally formed as a single with the second shielding layer 720.

The third shielding layer 730 may be spaced apart from each other. A plurality of third holes 730H may be defined in the third shielding layer 730. The third holes 730H may be disposed to overlap the (1-1)th holes 710H1 of the first shielding layer 710, respectively. In some embodiments, when viewed from a direction substantially perpendicular to the substrate 100, the center of each of the third holes 730H may coincide with the center of each of the (1-1)th holes 710H1.

The area of an overlapping opening area OVA where the (1-1)th hole 710H1 of the first shielding layer 710 overlaps the third hole 730H of the third shielding layer 730 may be 13% or more of the total area of the first corner area CNA1. When viewed from a direction substantially perpendicular to the upper surface of the substrate 100, the overlapping opening area OVA is an area that is not covered with the first shielding layer 710 and the third shielding layer 730, and may be a path through which gas generated in the first planarization layer 211, the second planarization layer 212, and the third planarization layer 213 is discharged. When a sufficient path for discharge of gas is not secured, the emission area of pixels located in the display area (see DA of FIG. 6) adjacent to the first corner area CNA1 may be reduced, and thus, light emission quality may be reduced. In the display apparatus according to the present embodiments, because the area of the overlapping opening area OVA is 13% or more of the total area of the first corner area CNA1, deterioration of light emission quality may be prevented or reduced by securing a sufficient path for discharge of gas generated in the first planarization layer 211, the second planarization layer 212, and the third planarization layer 213.

Figure 12:
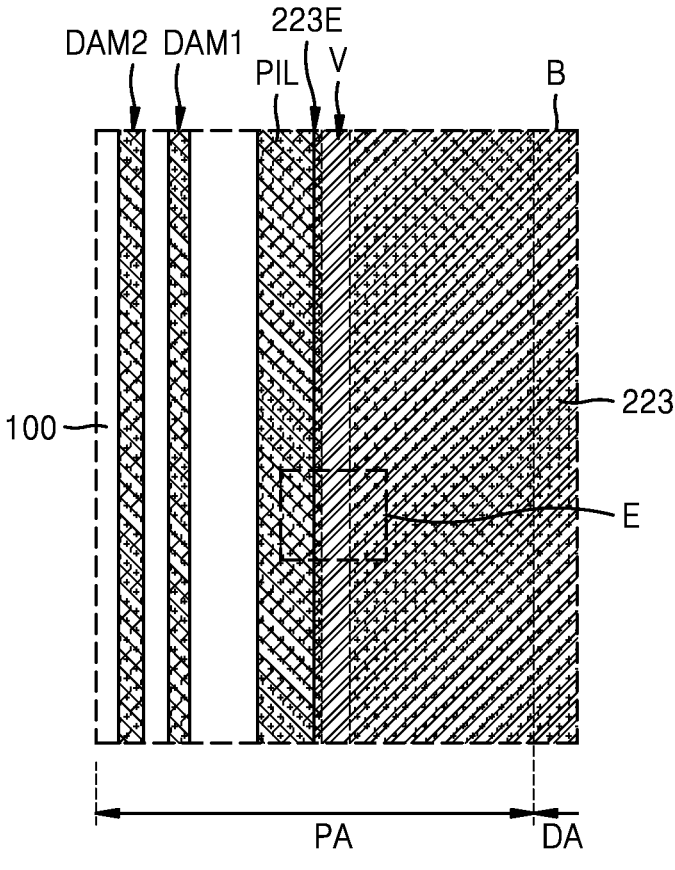
FIG. 12 is an enlarged plan view schematically illustrating a portion of a peripheral area in a display apparatus according to an embodiment.

FIG. 12 is an enlarged plan view schematically illustrating a portion of a peripheral area in a display apparatus according to an embodiment. FIG. 12 schematically illustrates the planarization layer PIL and the opposite electrode 223 of region B in the display apparatus illustrated in FIG. 1.

Referring to FIG. 12, the first dam DAM1 and the second dam DAM2 surrounding at least a portion of the display area DA may be arranged in the peripheral area PA. The first dam DAM1 and the second dam DAM2 may have a loop shape with one side open so as to surround at least a portion of the display area DA. The first dam DAM1 and the second dam DAM2 may include at least one organic layer. The first dam DAM1 and the second dam DAM2 may include the same material as that of at least one of the first planarization layer (see 211 of FIG. 5), the second planarization layer (see 212 of FIG. 5), the third planarization layer (see 213 of FIG. 5), the bank layer (see 215 of FIG. 5), and the spacer (see 217 of FIG. 5) in the display area DA. The first dam DAM1 and the second dam DAM2 may be configured to control the flow of monomers forming the organic encapsulation layer (see 320 of FIG. 5) of the encapsulation layer (see 300 of FIG. 5).

The planarization layer PIL is arranged in the peripheral area PA inside the first dam DAM1 and the second dam DAM2. The planarization layer PIL may include the first planarization layer (see 211 of FIG. 5), the second planarization layer (see 212 of FIG. 5), and the third planarization layer (see 213 of FIG. 5) of the display area DA, which extend to the peripheral area PA and are sequentially stacked in this stated order.

The planarization layer PIL may include a valley portion V surrounding at least a portion of the display area DA. The valley portion V may have a loop shape in which one side surrounding at least a portion of the display area DA is opened. Because all or at least a portion of the first planarization layer (see 211 of FIG. 5), the second planarization layer (see 212 of FIG. 5), and the third planarization layer (see 213 of FIG. 5) each including an organic material are removed from the valley portion V, a path through which impurities, such as moisture, penetrate into the display area (see DA of FIG. 1) from the outside of the substrate 100 may be blocked or reduced.

The opposite electrode 223 may overlap the valley portion V. In this regard, FIG. 12 illustrates that the end 223E of the opposite electrode 223 is disposed outside the valley portion V so that the opposite electrode 223 covers the valley portion V. In other embodiments, the opposite electrode 223 may not overlap the valley portion V. In this case, the end 223E of the opposite electrode 223 may be inside the valley portion V.

Figure 13:
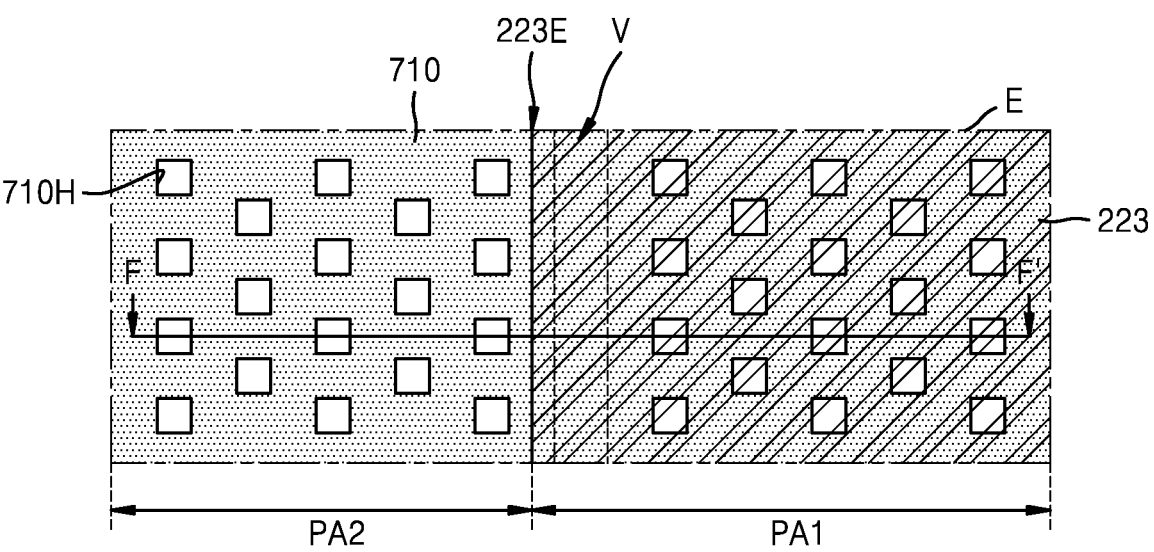
FIGS. 13 and 14 are enlarged plan views schematically illustrating a portion of a display apparatus according to an embodiment
Figure 14:
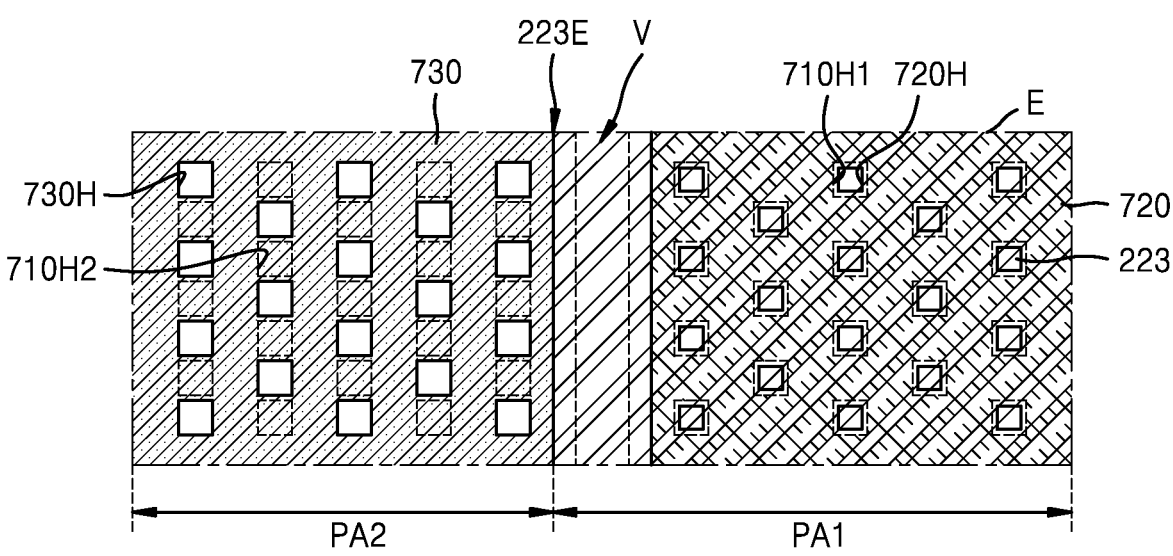

FIGS. 13 and 14 are enlarged plan views schematically illustrating a portion of a display apparatus according to an embodiment, and FIGS. 15, 16, 17, 18, and 19 are cross-sectional views schematically illustrating a portion of the display apparatus according to various embodiments. FIGS. 13 and 14 are enlarged plan views of region E in the display apparatus illustrated in FIG. 12, and FIGS. 15, 16, 17, 18, and 19 are cross-sectional views of the display apparatus taken along line F-F' of FIG. 13.

FIG. 13 schematically illustrates the opposite electrode 223 and the first shielding layer 710, and FIG. 14 schematically illustrates the opposite electrode 223, the second shielding layer 720, and the third shielding layer 730.

Referring to FIGS. 13, 14, 15, and 16, a first peripheral area PA1 and a second peripheral area PA2 may be defined based on the end 223E of the opposite electrode 223. The first peripheral area PA1 may overlap the opposite electrode 223, and the second peripheral area PA2 may not overlap the opposite electrode 223.

One or more inorganic insulating layers IIL may be disposed on the substrate 100. The one or more inorganic insulating layers IIL may each include the same material as that of at least one of the buffer layer (see 201 of FIG. 5), the first gate insulating layer (see 203 of FIG. 5), the second gate insulating layer (see 205 of FIG. 5), the first interlayer insulating layer (see 207 of FIG. 5), the third gate insulating layer (see 209 of FIG. 5), and the second interlayer insulating layer (see 210 of FIG. 5) in the display area (see DA of FIG. 5).

A first driving circuit DC1 and a second driving circuit DC2 may be disposed on the substrate 100 with the valley portion V therebetween. The first driving circuit DC1 may be a scan driving circuit, and the second driving circuit DC2 may be an emission control driving circuit. The first driving circuit DC1 may overlap the opposite electrode 223, and the second driving circuit DC2 may not overlap the opposite electrode 223. Lines connecting the first driving circuit DC1 to the pixels (see P of FIG. 1) may be disposed on the first driving circuit DC1. For example, signal lines may be between the inorganic insulating layer IIL and the first planarization layer 211 in the first peripheral area PA1 or between the first planarization layer 211 and the second planarization layer 212.

The first planarization layer 211, the second planarization layer 212, and the third planarization layer 213 may overlap the first peripheral area PA1 and the second peripheral area PA2 and may be sequentially disposed on the inorganic insulating layers IL. The first planarization layer 211, the second planarization layer 212, and the third planarization layer 213 may each have an opening surrounding at least a portion of the display area (see DA of FIG. 1). When viewed from a direction substantially perpendicular to the upper surface of the substrate 100, an opening 2110P of the first planarization layer 211, an opening 2120P of the second planarization layer 212, and an opening 2130P of the third planarization layer 213 may overlap each other to form the valley portion V.

A first shielding layer 710 may be disposed on the third planarization layer 213. The first shielding layer 710 may be disposed to overlap the first peripheral area PA1 and the second peripheral area PA2. The first shielding layer 710 may include a plurality of (1-1)th holes 710H1 overlapping the first peripheral area PA1 and spaced apart from each other, and a plurality of (1-2)th holes 710H2 overlapping the second peripheral area PA2 and spaced apart from each other. The (1-1)th holes 710H1 and the (1-2)th holes 710H2 may function as a path configured to discharge gas generated in organic layers under the first shielding layer 710.

The first shielding layer 710 may include the same material as that of the pixel electrode (see 221 of FIG. 5) in the display area (see DA of FIG. 5). For example, the first shielding layer 710 may be formed during a process of patterning the pixel electrode 221.

A second shielding layer 720 may be disposed to overlap the first peripheral area PA1, but may not overlap the second peripheral area PA2. The second shielding layer 720 may be disposed to overlap the opposite electrode 223. The second shielding layer 720 may be disposed between the second planarization layer 212 and the third planarization layer 213. The second shielding layer 720 may include the same material as those of the data line (see DL of FIG. 5) and the second signal line (see 1230 of FIG. 5) in the display area (see DA of FIG. 5). For example, the second shielding layer 720 may be formed during a process of patterning the data line (see DL of FIG. 5) and the second signal line (see 1230 of FIG. 5).

A plurality of second holes 720H overlapping the first peripheral area PA1 may be formed in the second shielding layer 720 and spaced apart from each other. The second holes 720H may be disposed to overlap the (1-1)th holes 710H1 of the first shielding layer 710, respectively in the z-direction. In some embodiments, when viewed from a direction substantially perpendicular to the substrate 100, the center of each of the second holes 720H may coincide with the center of each of the (1-1)th holes 710H1. The sizes of the second holes 720H may be equal to or different from the sizes of the (1-1)th holes 710H1.

The area of an overlapping opening area OVA where the (1-1)th hole 710H1 of the first shielding layer 710 overlaps the second hole 720H of the second shielding layer 720 may be 13% or more of the total area of the first peripheral area PA1. When viewed from a direction substantially perpendicular to the upper surface of the substrate 100, the overlapping opening area OVA is an area that is not covered with the first shielding layer 710 and the second shielding layer 720, and may be a path through which gas generated in the first planarization layer 211, the second planarization layer 212, and the third planarization layer 213 is discharged.

Figure 15:
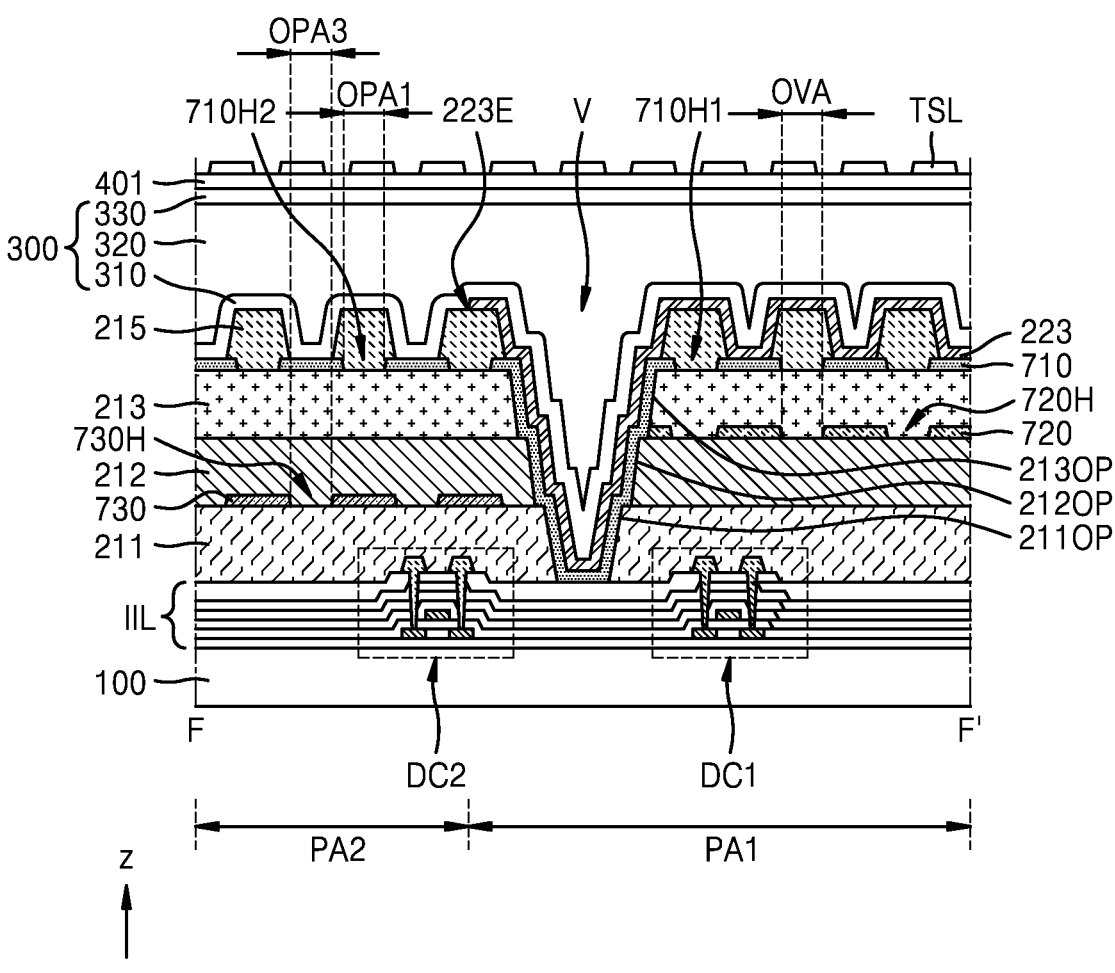
FIGS. 15, 16, 17, 18, and 19 are cross-sectional views schematically illustrating a portion of the display apparatus according to various embodiments.

A third shielding layer 730 may be disposed to overlap the second peripheral area PA2, but may not overlap the first peripheral area PA1. The third shielding layer 730 may be disposed on a layer that is different from the first shielding layer 710 and the second shielding layer 720. In this regard, FIG. 15 illustrates that the third shielding layer 730 is between the first planarization layer 211 and the second planarization layer 212. The third shielding layer 730 may include the same material as that of the first signal line (see 1220 of FIG. 5) in the display area (see DA of FIG. 5). For example, the third shielding layer 730 may be formed during a process of patterning the first signal line (see 1220 of FIG. 5).

A plurality of third holes 730H overlapping the second peripheral area PA2 may be formed in the third shielding layer 730 and spaced apart from each other. The third holes 730H may be disposed not to overlap the (1-2)th holes 710H2 of the first shielding layer 710. In other words, the third holes 730H may be apart from the (1-2)th holes 710H2. When viewed from a direction substantially perpendicular to the upper surface of the substrate 100, the first opening area OPA1 that is not covered with the first shielding layer 710 by the (1-2)th holes 710H2 may be covered with the third shielding layer 730, and the third opening area OPA3 that is not covered with the third shielding layer 730 by the third holes 730H may be covered with the first shielding layer 710. Accordingly, when viewed from a direction substantially perpendicular to the upper surface of the substrate 100, the second peripheral area PA2 may be covered with the first shielding layer 710 and the third shielding layer 730. Because the valley portion V is between the second peripheral area PA2 and the display area DA, gas generated in the first planarization layer 211, the second planarization layer 212, and the third planarization layer 213 in the second peripheral area PA2 may have little or no effect on display quality. Accordingly, in the second peripheral area PA2, the first shielding layer 710 and the third shielding layer 730 may not require an overlapping opening area.

A bank layer 215 may be disposed on the first shielding layer 710 and the third planarization layer 213. The bank layer 215 may have a mesh shape with a through hole, when viewed from a direction substantially perpendicular to the upper surface of the substrate 100. In some embodiments, the bank layer 215 in the first peripheral area PA1 and the second peripheral area PA2 may be omitted.

The opposite electrode 223 may be disposed on the bank layer 215 and overlap the first peripheral area PA1. The opposite electrode 223 may extend from the display area DA to the first peripheral area PA1 and may be integrally formed a single body. When viewed from a direction substantially perpendicular to the upper surface of the substrate 100, the opposite electrode 223 may cover the first peripheral area PA1. Because the opposite electrode 223 does not have an opening or a through hole, the opposite electrode 223 may cover the overlapping opening area OVA in which the (1-1)th hole 710H of the first shielding layer 710 overlaps the second hole 720H of the second shielding layer 720.

In some embodiments, as illustrated in FIG. 15, the opposite electrode 223 may overlap the valley portion V and cover the inner surfaces of the opening 2110P of the first planarization layer 211, the opening 2120P of the second planarization layer 212, and the opening 2130P of the third planarization layer 213. For example, the end 223E of the opposite electrode 223 may be located in an outer region of the valley portion V. The outer region of the valley portion V refers to an area far from the display area DA with respect to the valley portion V.

Figure 16:
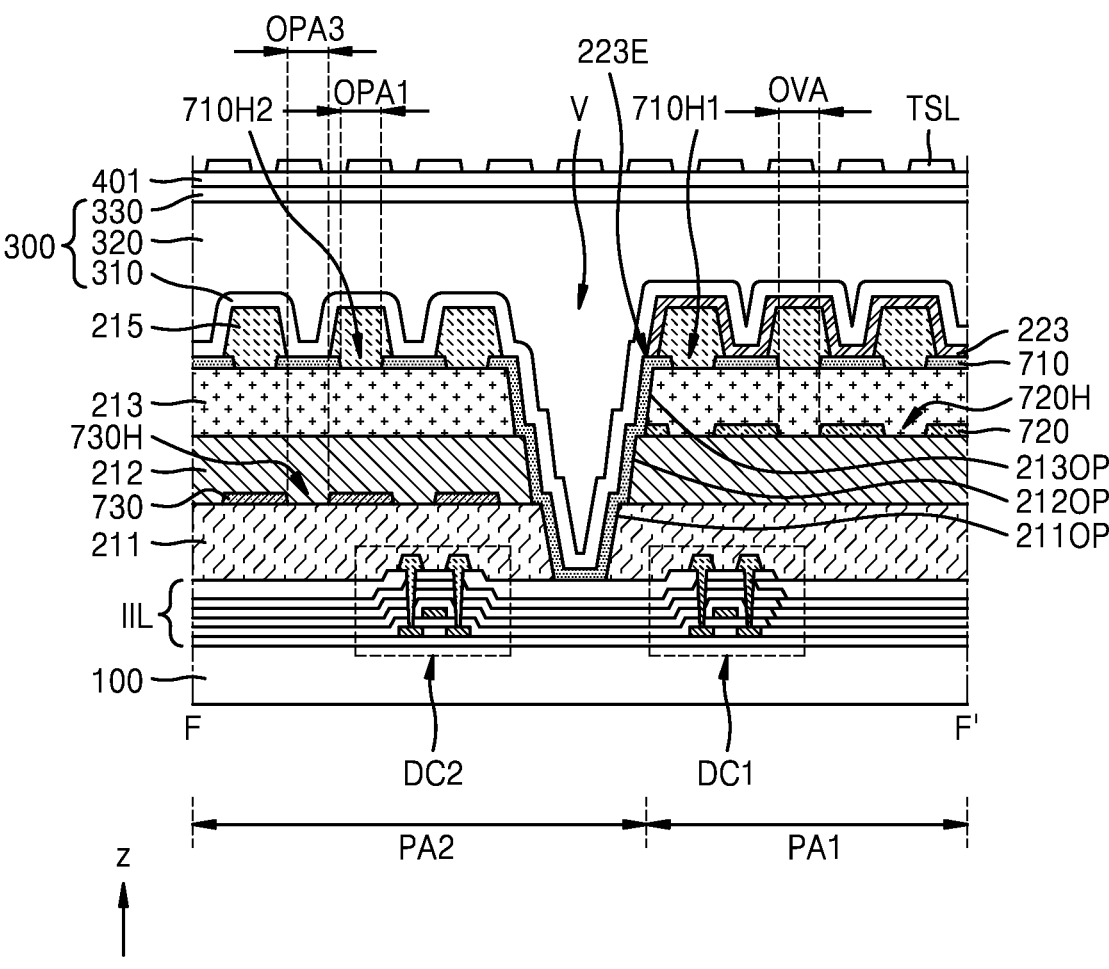

In other embodiments, as illustrated in FIG. 16, the opposite electrode 223 may not overlap the valley portion V.

The end 223E of the opposite electrode 223 may be located in an inner region of the valley portion V. The inner region of the valley portion V refers to an area close to the display area DA with respect to the valley portion V. The first shielding layer 710 may cover the inner surfaces of the opening 2110P of the first planarization layer 211, the opening 2120P of the second planarization layer 212, and the opening 2130P of the third planarization layer 213, which overlapping forms the valley portion V in the z-direction.

An encapsulation layer 300 may be disposed on the opposite electrode 223 and the bank layer 215. The encapsulation layer 300 may extend from the display area DA to the second peripheral area PA2 through the first peripheral area PA1. As described above, the encapsulation layer 300 may include at least one inorganic encapsulation layer and at least one organic encapsulation layer.

A first touch insulating layer 401 may be disposed on the encapsulation layer 300. The first touch insulating layer 401 may be an insulating layer that provides a base surface of the input sensing layer (see 400 of FIG. 4). The first touch insulating layer 401 may include an inorganic material or a composite material. The first touch insulating layer 401 may be replaced with an organic insulating layer.

An input sensing line TSL may be disposed on the first touch insulating layer 401. As described above, the input sensing line TSL may be arranged in the touch peripheral area (see TPA of FIG. 4), and the touch peripheral area TPA may overlap the first peripheral area PA1 and the second peripheral area PA2 of the substrate 100. In the first peripheral area PA1 and the second peripheral area PA2, the input sensing line TSL may overlap the first driving circuit DC1 and the second driving circuit DC2. As the input sensing line TSL and the driving circuits DC1 and DC2 overlap each other in a plan view, a coupling effect may cause noise to occur in an electrical signal transmitted through the input sensing line TSL, or may cause noise to occur in an electrical signal transmitted through the driving circuits DC1 and DC2. In the case of the display apparatus according to embodiments, when viewed from a direction substantially perpendicular to the substrate 100, the first peripheral area PA1 is covered with the first shielding layer 710, the second shielding layer 720, and the opposite electrode 223, and the second peripheral area PA2 is covered with the first shielding layer 710 and the third shielding layer 730. Accordingly, the occurrence of the coupling effect between the input sensing line TSL and the driving circuits DC1 and DC2 may be prevented or minimized.

Figure 17:
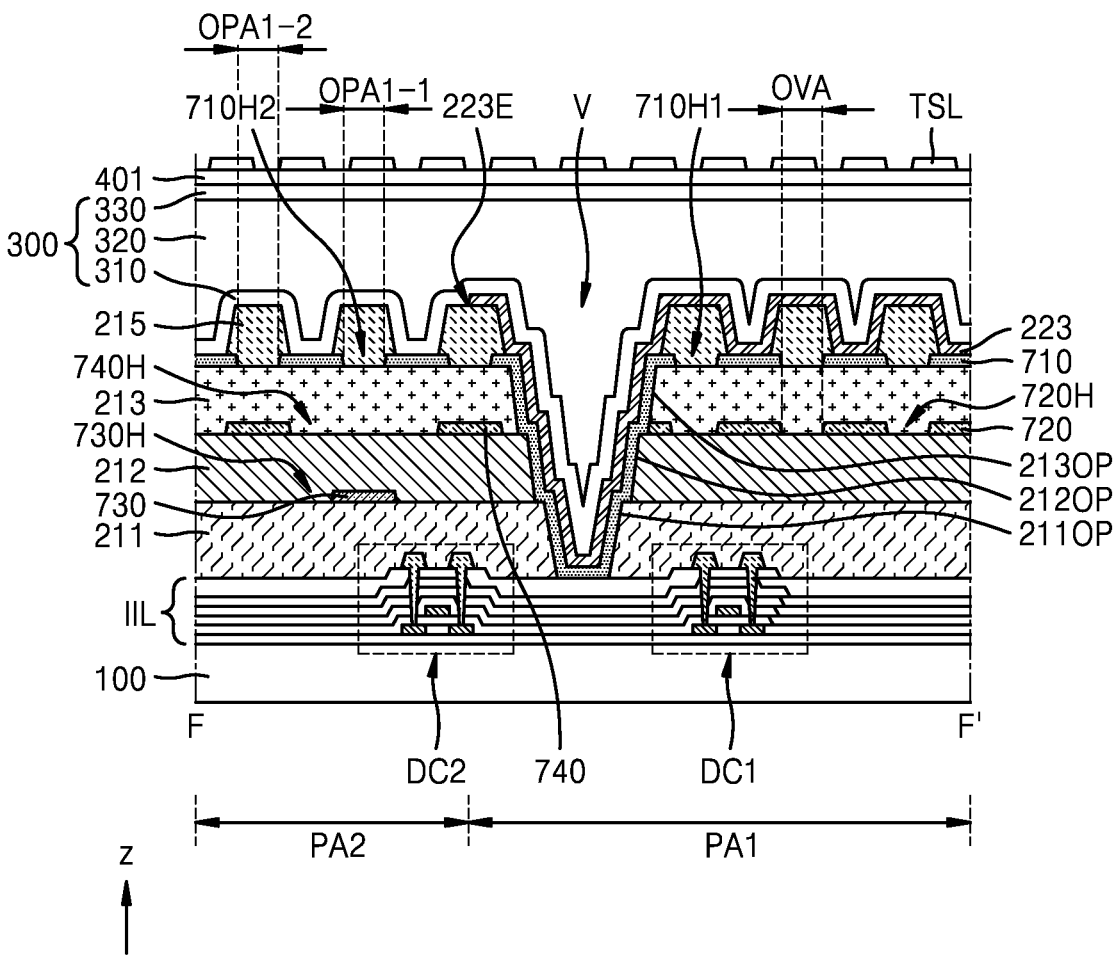

Referring to FIG. 17, a fourth shielding layer 740 may be disposed to overlap the second peripheral area PA2. The fourth shielding layer 740 may overlap an edge portion of the first peripheral area PA1 overlapping the outer region of the valley portion V. The fourth shielding layer 740 may be disposed on a layer that is different from the first shielding layer 710 and the third shielding layer 730. In this regard, FIG. 17 illustrates that the fourth shielding layer 740 is disposed between the second planarization layer 212 and the third planarization layer 213, but the disclosure is not limited thereto. The fourth shielding layer 740 may be disposed between the inorganic insulating layer IIL and the first planarization layer 211.

A plurality of fourth holes 740H may be formed in the fourth shielding layer 740. The fourth holes 740H may function as a path configured to discharge gas generated in organic layers under the fourth shielding layer 740. When viewed from a direction perpendicular to the upper surface of the substrate 100, the second peripheral area PA2 may be covered with the first shielding layer 710, the third shielding layer 730, and the fourth shielding layer 740. As illustrated in FIG. 17, a (1-1)th opening area OPA1-1 and a (1-2)th opening area OPA1-2 exposed by the (1-2)th holes 710H2 of the first shielding layer 710 may overlap the third shielding layer 730 and the fourth shielding layer 740, respectively. Accordingly, the areas of the third hole 730H of the third shielding layer 730 and the fourth hole 740H of the fourth shielding layer 740 may be further expanded, and thus, a sufficient gas discharge path between the organic layers may be secured.

Figure 18:
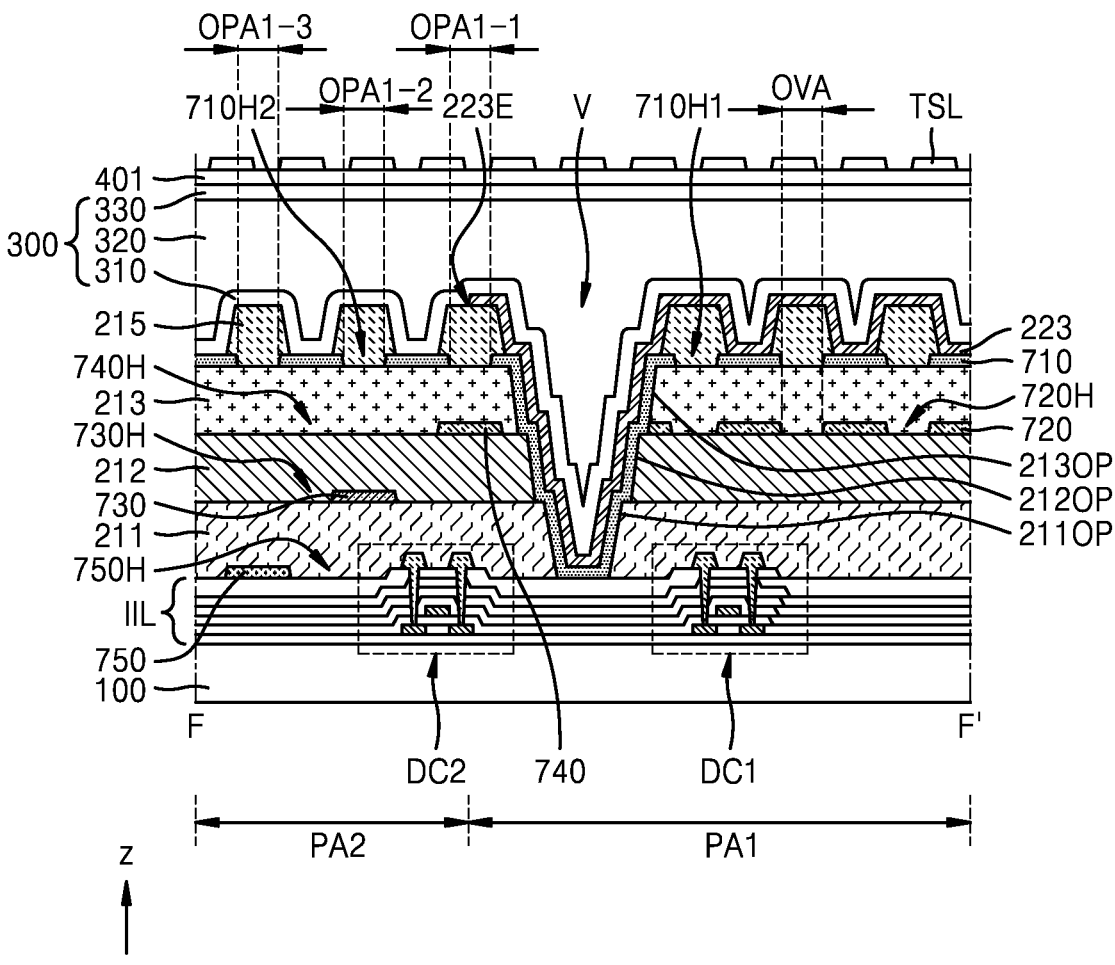

Referring to FIG. 18, a third shielding layer 730, a fourth shielding layer 740 and a fifth shielding layer 750 may be disposed to overlap the second peripheral area PA2. The a third shielding layer 730, the fourth shielding layer 740 and the fifth shielding layer 750 may overlap an edge portion of the first peripheral area PA1 overlapping the outer region of the valley portion V. The first shielding layer 710, the third shielding layer 730, the fourth shielding layer 740, and the fifth shielding layer 750 may be disposed on different layers from each other. FIG. 18 illustrates that the fourth shielding layer 740 is between the second planarization layer 212 and the third planarization layer 213, and the fifth shielding layer 750 is disposed between the inorganic insulating layer IIL and the first planarization layer 211.

When viewed from a direction perpendicular to the upper surface of the substrate 100, the second peripheral area PA2 may be covered with the first shielding layer 710, the third shielding layer 730, the fourth shielding layer 740, and the fifth shielding layer 750. In some embodiments, some of the third shielding layer 730, the fourth shielding layer 740, and the fifth shielding layer 750 may be provided as metal island patterns separated from each other. In this regard, FIG. 18 illustrates that the (1-1)th opening area OPA1-1, the (1-2)th opening area OPA1-2, and the (1-3)th opening area OPA1-3 exposed by the (1-2)th holes 710H2 of the first shielding layer 710 overlap the fourth shielding layer 740, the third shielding layer 730, and the fifth shielding layer 750, respectively. The (1-1)th opening area OPA1-1, the (1-2)th opening area OPA1-2, and the (1-3)th opening area OPA1-3 may overlap at least one of the third shielding layer 730, the fourth shielding layer 740, and the fifth shielding layer 750.

FIGS. 17 and 18 illustrate that the sizes (or areas) and/or intervals of the (1-1)th hole 710H1 and the (1-2)th hole 710H2 of the first shielding layer 710 are equal to each other, but the disclosure is not limited thereto. The sizes (or areas) and/or intervals of the (1-1)th hole 710H1 and the (1-2)th hole 710H2 of the first shielding layer 710 are different from each other.

Figure 19:
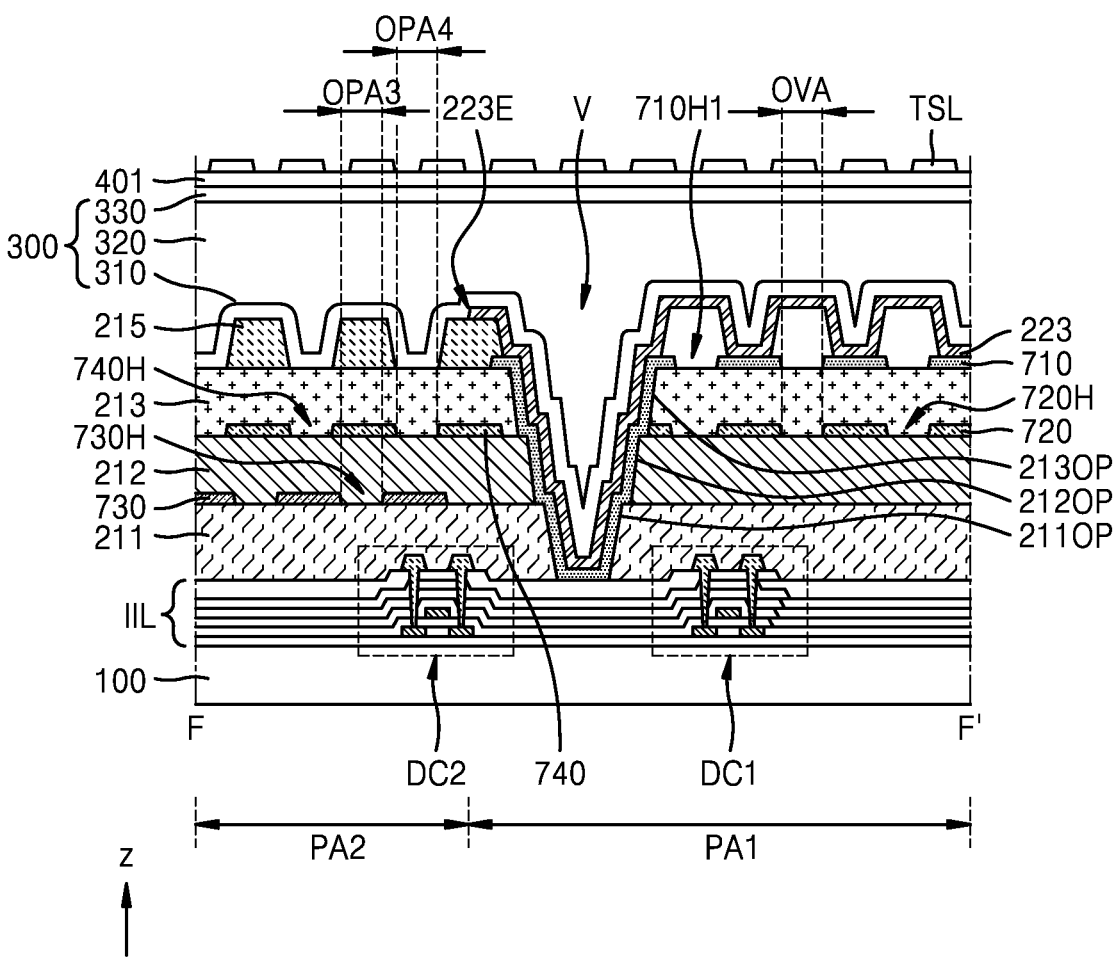

Referring to FIG. 19, the first shielding layer 710 may not overlap the second peripheral area PA2. When viewed from a direction perpendicular to the upper surface of the substrate 100, the second peripheral area PA2 may be covered with the third shielding layer 730 and the fourth shielding layer 740. The third shielding layer 730 and the fourth shielding layer 740 may be disposed on layers that are different from the first shielding layer 710 and the second shielding layer 720. For example, the third shielding layer 730 may be between the first planarization layer 211 and the second planarization layer 212, and the fourth shielding layer may be between the second planarization layer 212 and the third planarization layer 213. Alternatively, the third shielding layer 730 may be between the first planarization layer 211 and the second planarization layer 212, and the fourth shielding layer may be disposed between the inorganic insulating layer IIL and the first planarization layer 211.

A plurality of third holes 730H may be formed in the third shielding layer 730, and A plurality of fourth holes 740H may be formed in the fourth shielding layer 740. The third opening area OPA3 exposed by the third holes 730H may overlap the fourth shielding layer 740. The fourth opening area OPA4 exposed by the fourth holes 740H may overlap the third shielding layer 730.

In some embodiments, although not illustrated in FIG. 19, a fifth shielding layer overlapping the second peripheral area PA2 may be further included. In this case, the second peripheral area PA2 may be covered with the third shielding layer 730, the fourth shielding layer 740, and the fifth shielding layer.

Figure 20:
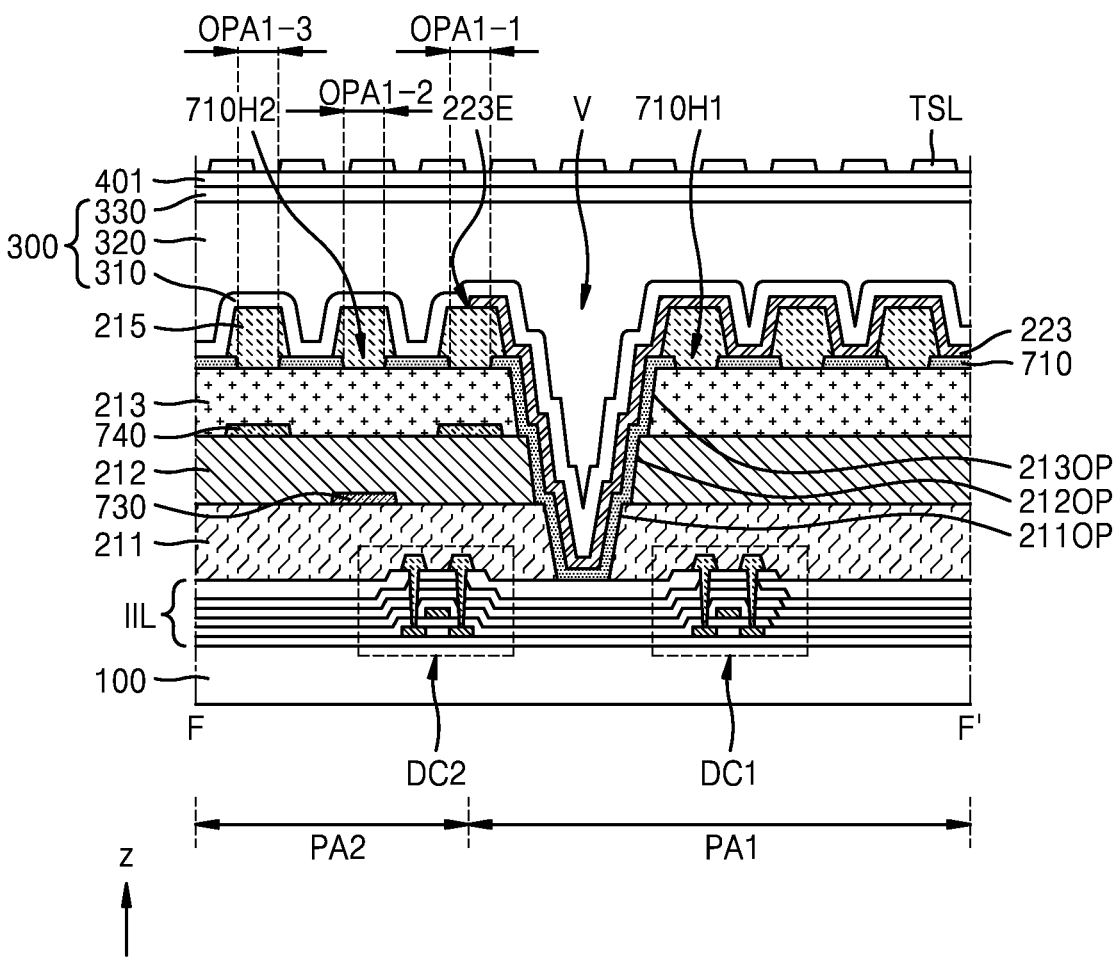
FIGS. 20 and 21 are cross-sectional views schematically illustrating a portion of a display apparatus according to embodiments.
Figure 21:
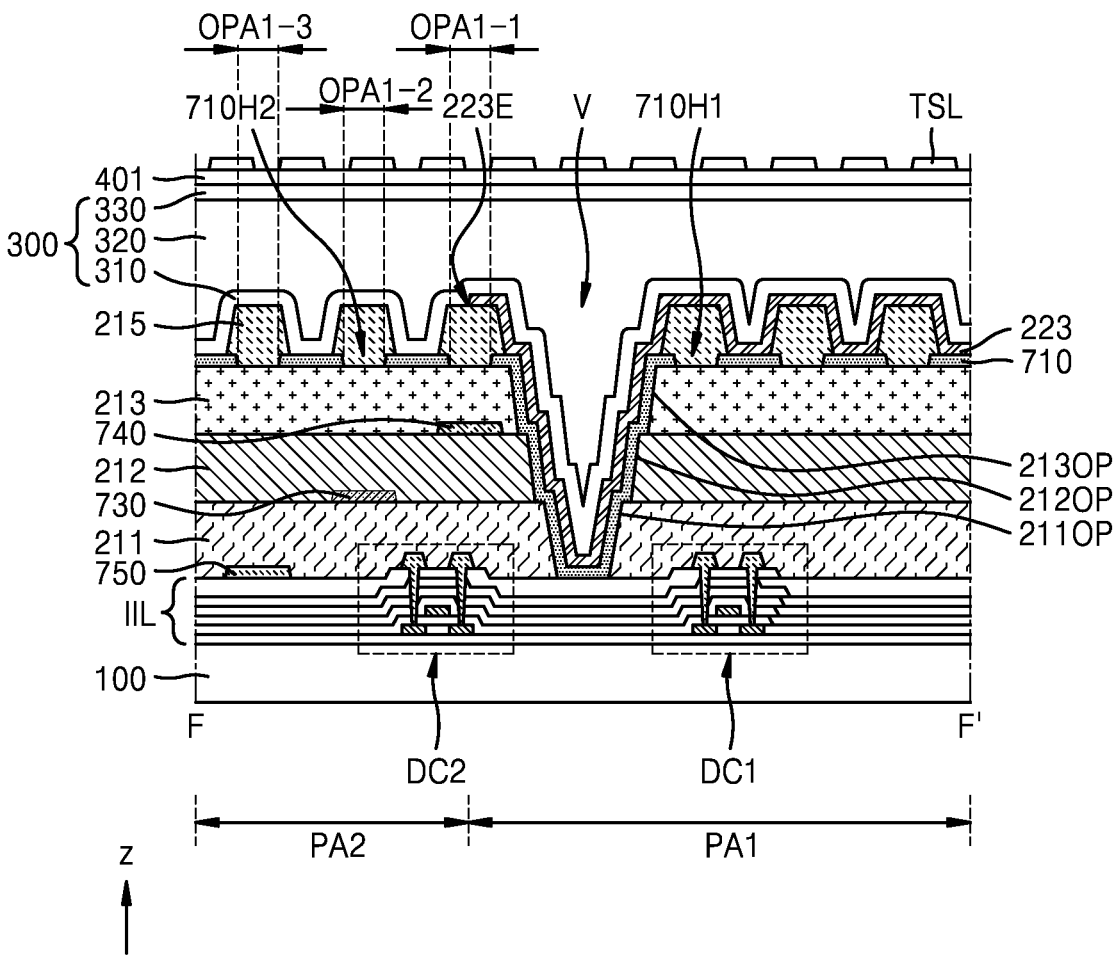

FIGS. 20 and 21 are cross-sectional views schematically illustrating a portion of a display apparatus according to embodiments. FIGS. 20 and 21 are cross-sectional views of the display apparatus taken along line F-F' of FIG. 13.

Referring to FIGS. 20 and 21, the first shielding layer 710 and the opposite electrode 223 may be arranged in the first peripheral area PA1, and the second shielding layer (not illustrated) may be omitted. When viewed from a direction perpendicular to the upper surface of the substrate 100, the first peripheral area PA1 may be covered with the first shielding layer 710 and the opposite electrode 223. The first shielding layer 710 and the opposite electrode 223 may prevent or reduce a coupling effect between the input sensing line TSL and the first driving circuit DC1.

As illustrated in FIG. 20, the first shielding layer 710, the third shielding layer 730, and the fourth shielding layer 740 may be arranged in the second peripheral area PA2. The third shielding layer 730 and the fourth shielding layer 740 may overlap an edge portion of the first peripheral area PA1 overlapping the outer region of the valley portion V. The first shielding layer 710, the third shielding layer 730, and the fourth shielding layer 740 may be disposed on different layers from each other. For example, the third shielding layer 730 may be between the first planarization layer 211 and the second planarization layer 212, and the fourth shielding layer may be between the second planarization layer 212 and the third planarization layer 213. Alternatively, the third shielding layer 730 may be between the first planarization layer 211 and the second planarization layer 212, and the fourth shielding layer may be disposed between the inorganic insulating layer IIL and the first planarization layer 211. The first shielding layer 710, the third shielding layer 730, and the fourth shielding layer 740 may each have a plurality of holes. When viewed from a direction perpendicular to the upper surface of the substrate 100, the second peripheral area PA2 may be covered with the first shielding layer 710, the third shielding layer 730, and the fourth shielding layer 740. The (1-1)th opening area OPA1-1 and the (1-2)th opening area OPA1-2 exposed by the (1-2)th holes 710H2 of the first shielding layer 710 may overlap the third shielding layer 730 and the fourth shielding layer 740, respectively.

Alternatively, as illustrated in FIG. 21, the first shielding layer 710, the third shielding layer 730, the fourth shielding layer 740, and the fifth shielding layer 750 may be arranged in the second peripheral area PA2. The third shielding layer 730, the fourth shielding layer 740, and the fifth shielding layer 750 may overlap an edge portion of the first peripheral area PA1 overlapping the outer region of the valley portion V. The first shielding layer 710, the third shielding layer 730, the fourth shielding layer 740, and the fifth shielding layer 750 may be disposed on different layers from each other. For example, the third shielding layer 730 may be between the first planarization layer 211 and the second planarization layer 212, the fourth shielding layer 740 may be disposed between the second planarization layer 212 and the third planarization layer 213, and the fifth shielding layer 750 may be between the inorganic insulating layer IIL and the first planarization layer 211. When viewed from a direction perpendicular to the upper surface of the substrate 100, the second peripheral area PA2 may be covered with the first shielding layer 710, the third shielding layer 730, the fourth shielding layer 740, and the fifth shielding layer 750. In some embodiments, some of the third shielding layer 730, the fourth shielding layer 740, and the fifth shielding layer 750 may be provided as metal island patterns separated from each other.

In some embodiments, the first shielding layer 710 may overlap the first peripheral area PA1 and may not overlap the second peripheral area PA2, and only the third shielding layer 730 and the fourth shielding layer 740 may be arranged in the second peripheral area PA2. For example, the third shielding layer 730 may be disposed between the first planarization layer 211 and the second planarization layer 212, and the fourth shielding layer may be between the second planarization layer 212 and the third planarization layer 213. Alternatively, the third shielding layer 730 may be disposed between the first planarization layer 211 and the second planarization layer 212, and the fourth shielding layer may be disposed between the inorganic insulating layer IIL and the first planarization layer 211.

According to one or more embodiments, a display apparatus, which is capable of displaying a high-quality image while the area of a dead space is reduced may be implemented. The scope of the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A display apparatus comprising:
a substrate including a display area, a first corner area disposed at a corner of the display area, and a second corner area disposed outside the first corner area;
an inorganic insulating layer disposed on the substrate;
a first planarization layer and a second planarization layer disposed on the inorganic insulating layer, each of the first planarization layer and the second planarization layer overlapping the first corner area;
a third planarization layer disposed on the second planarization layer and overlapping the first corner area and the second corner area;
a display element layer disposed on the third planarization layer, the display element layer including a pixel electrode, an emission layer, and an opposite electrode;
a first shielding layer disposed on the third planarization layer and overlapping the first corner area and the second corner area, wherein a plurality of first holes are defined in the first shielding layer; and
a second shielding layer disposed on the inorganic insulating layer and overlapping the second corner area, wherein the second shielding layer is in direct contact with the inorganic insulating layer in the second corner area.

2. The display apparatus of claim 1, wherein the opposite electrode extends from the display area to the first corner area, and
  the first corner area is covered with the first shielding layer and the opposite electrode in a plan view.

3. The display apparatus of claim 1, further comprising a third shielding layer disposed between the second planarization layer and the third planarization layer and overlapping the first corner area, wherein a plurality of second holes are defined in the third shielding layer,
  wherein the plurality of first holes overlap the plurality of second holes.

4. The display apparatus of claim 3, wherein an overlapping area of the plurality of first holes and the plurality of second holes is 13% or more of a total area of the first corner area.

5. The display apparatus of claim 3, wherein the second shielding layer and the third shielding layer are integrally formed as a single body.

6. The display apparatus of claim 1, wherein the second corner area is covered with the first shielding layer and the second shielding layer in a plan view.

7. A display apparatus comprising:
  a substrate comprising a display area, a first peripheral area surrounding at least a portion of the display area, and a second peripheral area disposed outside the first peripheral area;
  an inorganic insulating layer disposed on the substrate;
  a first planarization layer, a second planarization layer, and a third planarization layer sequentially disposed on the inorganic insulating layer in this stated order;
  a display element layer disposed on the third planarization layer, the display element layer including a pixel electrode, an emission layer, and an opposite electrode;
  a first shielding layer disposed on the third planarization layer, wherein a plurality of first holes are defined in the first shielding layer;
  a second shielding layer disposed on the second planarization layer and overlapping the first peripheral area, wherein a plurality of second holes are defined in the second shielding layer; and
  a third shielding layer disposed between the inorganic insulating layer and the second planarization layer and overlapping the second peripheral area, wherein a plurality of third holes are defined in the third shielding layer.

8. The display apparatus of claim 7, wherein the opposite electrode extends from the display area to the first peripheral area, and
  the first peripheral area is covered with the first shielding layer, the second shielding layer, and the opposite electrode in a plan view.

9. The display apparatus of claim 7, further comprising a valley portion passing through the first planarization layer, the second planarization layer, and the third planarization layer,
  wherein the first shielding layer covers the valley portion.

10. The display apparatus of claim 9, wherein the plurality of first holes are spaced apart from the valley portion.

11. The display apparatus of claim 7, further comprising a valley portion passing through the first planarization layer, the second planarization layer, and the third planarization layer,
  wherein the opposite electrode covers the valley portion.

12. The display apparatus of claim 7, further comprising:
  a first driving circuit disposed between the substrate and the first planarization layer and overlapping the first peripheral area; and
  a second driving circuit disposed between the substrate and the first planarization layer and overlapping the second peripheral area.

13. The display apparatus of claim 7, wherein an overlapping area of the plurality of first holes and the plurality of second holes in the first peripheral area is 13% or more of a total area of the first peripheral area.

14. The display apparatus of claim 7, wherein the second peripheral area is covered with the first shielding layer and the third shielding layer in a plan view.

15. The display apparatus of claim 7, further comprising a fourth shielding layer overlapping the second peripheral area, wherein a plurality of fourth holes are defined in the fourth shielding layer,
  wherein the fourth shielding layer is disposed on a layer that is different from the third shielding layer, and
  the second peripheral area is covered with the first shielding layer, the third shielding layer, and the fourth shielding layer in a plan view.

16. The display apparatus of claim 7, further comprising:
  a fourth shielding layer disposed on the second planarization layer and overlapping the second peripheral area, wherein a plurality of fourth holes are defined in the fourth shielding layer; and
  a fifth shielding layer disposed on the inorganic insulating layer and overlapping the second peripheral area, wherein a plurality of fifth holes are defined in the fifth shielding layer,
  wherein the second peripheral area is covered with the first shielding layer, the third shielding layer, the fourth shielding layer, and the fifth shielding layer in a plan view.

17. A display apparatus comprising:
  a substrate comprising a display area, a first peripheral area surrounding at least a portion of the display area, and a second peripheral area disposed outside the first peripheral area;
  an inorganic insulating layer disposed on the substrate;
  a first planarization layer, a second planarization layer, and a third planarization layer sequentially disposed on the inorganic insulating layer in this stated order;
  a display element layer disposed on the third planarization layer, the display element layer comprising a pixel electrode, an emission layer, and an opposite electrode;
  a first shielding layer disposed on the third planarization layer, wherein a plurality of first holes are defined in the first shielding layer;
  a third shielding layer between the inorganic insulating layer and the second planarization layer and overlapping the second peripheral area, wherein a plurality of third holes are defined in the third shielding layer; and
  a fourth shielding layer disposed on a layer that is different from the first shielding layer and the third shielding layer and overlapping the second peripheral area, wherein a plurality of fourth holes are defined in the fourth shielding layer.

18. The display apparatus of claim 17, wherein the opposite electrode extends from the display area to the first peripheral area, and
  the first peripheral area is covered with the first shielding layer and the opposite electrode in a plan view.

19. The display apparatus of claim 17, further comprising a fifth shielding layer overlapping the second peripheral area, wherein a plurality of fifth holes are defined in the fifth shielding layer, wherein the fifth shielding layer is covered with the first shielding layer, the third shielding layer, and the fourth shielding layer, and the second peripheral area is covered with the first shielding layer, the third shielding layer, the fourth shielding layer, and the fifth shielding layer in a plan view.

\* \* \* \* \*